United States Patent
Park et al.

(10) Patent No.: US 9,269,430 B1
(45) Date of Patent: Feb. 23, 2016

(54) MEMORY DEVICE HAVING CROSS POINT ARRAY STRUCTURE, MEMORY SYSTEM, AND METHOD OF OPERATING MEMORY DEVICE

(71) Applicant: Samsung Electronics Co., Ltd., Suwon-si, Gyeonggi-do (KR)

(72) Inventors: Hyun-kook Park, Anyang-si (KR); Chi-weon Yoon, Seoul (KR); Yeong-taek Lee, Seoul (KR); Dae-seok Byeon, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/716,166

(22) Filed: May 19, 2015

(30) Foreign Application Priority Data

Aug. 22, 2014  (KR) .................. 10-2014-0109957

(51) Int. Cl.
  *G11C 11/00*  (2006.01)
  *G11C 13/00*  (2006.01)
(52) U.S. Cl.
  CPC ............ *G11C 13/003* (2013.01); *G11C 13/004* (2013.01); *G11C 13/0026* (2013.01); *G11C 13/0028* (2013.01); *G11C 13/0038* (2013.01); *G11C 13/0069* (2013.01)
(58) Field of Classification Search
  CPC ...................................................... G11C 11/00
  USPC ............ 365/46, 94, 100, 113, 129, 148, 163; 257/2–5, 296, E31.047, E27.006; 438/29, 95, 96, 166, 259, 365, 482, 438/486, 597; 977/754
  See application file for complete search history.

(56) References Cited

U.S. PATENT DOCUMENTS

| | | | |
|---|---|---|---|
| 7,907,467 B2 | 3/2011 | Park et al. | |
| 8,114,506 B2 | 2/2012 | Crawford, Jr. | |
| 8,270,193 B2 | 9/2012 | Siau et al. | |
| 8,386,883 B2 | 2/2013 | Franceschini et al. | |
| 8,427,885 B2 | 4/2013 | Mukai et al. | |
| 8,441,839 B2 | 5/2013 | Azuma et al. | |
| 8,467,229 B2 | 6/2013 | Ikeda et al. | |
| 8,526,237 B2 | 9/2013 | Samachisa et al. | |
| 2007/0285965 A1* | 12/2007 | Toda | G11C 5/02 365/148 |
| 2008/0002456 A1* | 1/2008 | Toda | G11C 11/5678 365/148 |
| 2008/0002457 A1* | 1/2008 | Toda | G11C 11/5678 365/148 |
| 2008/0198645 A1* | 8/2008 | Kang | G11C 5/025 365/148 |
| 2008/0198646 A1* | 8/2008 | Park | G11C 13/0007 365/148 |
| 2010/0202186 A1* | 8/2010 | Sato | G11C 29/832 365/148 |
| 2012/0047321 A1 | 2/2012 | Yoon et al. | |
| 2012/0099365 A1 | 4/2012 | Toda | |
| 2014/0056055 A1 | 2/2014 | Ikeda et al. | |

* cited by examiner

*Primary Examiner* — Harry W Byrne
(74) *Attorney, Agent, or Firm* — Myers Bigel & Sibley, PA

(57) ABSTRACT

In a method of operating a memory device having a cross point array structure, the memory device includes multiple tiles, and each of the tiles includes memory cells of multiple layers. The method includes accessing, in a first tile, multiple memory cells of a first layer disposed in a region where at least one first line and at least one second line cross each other, accessing, in the first tile, multiple memory cells of a second layer disposed in a region where at least one first line and at least one second line cross each other, and accessing, after the memory cells of the multiple layers of the first tile are accessed, multiple memory cells included in a second tile. Related memory devices and memory systems are also discussed.

20 Claims, 27 Drawing Sheets

| V | Vinhx | Vinhy | Vsely | Vselx | Vread |
|---|---|---|---|---|---|
| SET write | 3 | 1 | 4 | 0 | - |
| RESET write | 2 | 3 | 0 | 5 | - |
| READ | 1.5 | 0.5 | - | - | 2 |

| A28 | A27 | A26 | A25 | A24 | A23 | A22 | A21 | A20 | A19 |
|-----|-----|-----|-----|-----|-----|-----|-----|-----|-----|
| Tile | | | | | | Layer | | | |

Access Order: Region1_1 → Region2_1 → Region 1_2 → Region2_2

MEMORY DEVICE HAVING CROSS POINT ARRAY STRUCTURE, MEMORY SYSTEM, AND METHOD OF OPERATING MEMORY DEVICE

CROSS-REFERENCE TO RELATED APPLICATIONS

This application claims the benefit of and priority from Korean Patent Application No. 10-2014-0109957, filed on Aug. 22, 2014, in the Korean Intellectual Property Office, the disclosure of which is incorporated herein in its entirety by reference.

BACKGROUND

The inventive concepts relates to memory devices, and more particularly, to memory devices having a cross point array structure, memory systems, and methods of operating the memory devices.

According to demand for a high capacity and low power consumption memory devices, research for next-generation memory devices is being conducted. The next-generation memory devices may be required to have high integrity characteristics of dynamic random access memory (DRAM), non-volatile characteristics of flash memory, and/or high speed of static RAM (SRAM). As next-generation memory devices, phase change RAM (PRAM), nano floating gate memory (NFGM), polymer RAM (PoRAM), magnetic RAM (MRAM), ferroelectric RAM (FeRAM), and/or resistive RAM (RRAM) may be highlighted.

SUMMARY

The inventive concepts provide memory devices including multiple layers and an effective addressing method performed in a memory system.

According to an aspect of the inventive concepts, there is provided a method of operating a memory device having a cross point array structure, wherein the memory device includes multiple tiles, and each of the tiles includes memory cells of multiple layers, the method including: accessing, in a first tile, multiple memory cells of a first layer disposed in a region where at least one first line and at least one second line cross each other; accessing, in the first tile, multiple memory cells of a second layer disposed in a region where at least one first line and at least one second line cross each other; and accessing, after the memory cells of the multiple layers of the first tile are accessed, multiple memory cells included in a second tile.

After memory cells in matrix forms disposed in a region where multiple first lines and multiple second lines cross each other in the first layer of the first tile are accessed, memory cells in matrix forms disposed in a region where multiple first lines and multiple second lines cross each other in the second layer of the first tile may be accessed.

The first tile may further include a third layer, and a first line of the third layer and the first line of the second layer may be electrically connected, and after multiple memory cells of the third layer are accessed, memory cells of the second tile may be accessed.

After memory cells included in all layers of the first tile are accessed, memory cells of the second tile may be accessed.

The method may further include accessing memory cells of a third tile after memory cells included in all layers of the second tile are accessed.

Each of the memory cells may be a multilevel cell that stores n bits (where n is an integer equal to or greater than 2), and after data of n bits is completely stored in a first memory cell, data of n bits may be stored in a second memory cell.

Each of the memory cells may be a multilevel cell that stores n bits (where n is an integer equal to or greater than 2), and data may be sequentially stored bit by bit in multiple memory cells.

The first tile may include a first region and a second region that each includes at least one layer, and the first region may include memory cells of the first and second layers, wherein the method further includes accessing memory cells of the second region of the first tile after memory cells of the second tile are accessed.

First lines of layers included in the first region may be electrically connected to one another, and first lines included in the second region may be electrically connected to one another.

The first and second tiles may be defined as a first tile group, and the memory device may further include a second tile group including third and fourth tiles, and the first and second tiles may share at least one first line, and the third and fourth tiles may share at least one first line, and the method may further include accessing memory cells of the third and fourth tiles after all of memory cells of the first tile group are accessed.

The second tile may share at least one first line of the first layer with the first tile and share at least one first line of the second layer with a third tile, and the method may further include accessing memory cells of second layers of the second tile and the third tile after memory cells of a first layer of the second tile are accessed.

According to another aspect of the inventive concepts, there is provided a method of operating a memory device having a cross point array structure, wherein the memory device includes multiple tiles, and each of the tiles includes memory cells of multiple layers, the method including: accessing, in a first tile, memory cells of multiple layers of a first group whose first lines are electrically connected to one another; accessing, in the first tile, memory cells of multiple layers of a second group whose first lines are electrically connected to one another; and accessing memory cells of at least one layer included in a second tile.

According to some embodiments of the inventive concepts, in a method of operating a memory device, respective tiles that include memory cells located on different layers of a memory cell array are defined. Ones of the memory cells included in a first one of the respective tiles are accessed via first selection lines coupled thereto. The ones of the memory cells included in the first one of the respective tiles are located on at least two of the different layers of the memory cell array. After accessing the first one of the respective tiles, ones of the memory cells included in a second one of the respective tiles are accessed via second selection lines coupled thereto. The ones of the memory cells included in the second one of the respective tiles are located on one of the at least two of the different layers of the memory cell array.

In some embodiments, the first selection lines may be word lines or bit lines that are electrically connected. A selection voltage that is applied to the first selection lines may be maintained during the accessing of the ones of the memory cells included in the first one of the respective tiles that are located on the at least two of the different layers of the memory cell array.

In some embodiments, the ones of the memory cells on the at least two of the different layers may define one of a plurality of regions of the first one of the respective tiles. After accessing the ones of the memory cells included in the second one of the respective tiles, ones of the memory cells of another one of the plurality of regions of the first one of the respective tiles may be accessed.

In some embodiments, a tile group including the first one of the respective tiles and a third one of the respective tiles may be defined. Ones of the memory cells included in the third one of the respective tiles may be accessed prior to accessing the ones of the memory cells included in the second one of the respective tiles.

In some embodiments, the first and third ones of the respective tiles defining the tile group may share one of the word lines or bit lines that are electrically connected and coupled to the ones of the memory cells located on the at least two of the different layers of the memory cell array.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF EMBODIMENTS

Figure 1:
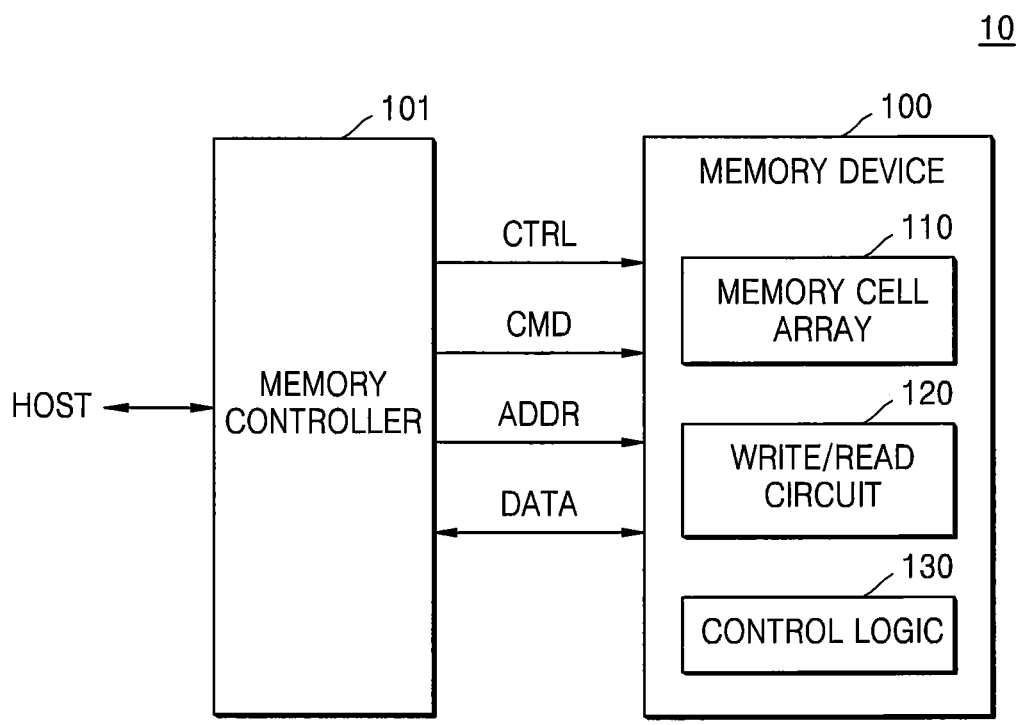
FIG. 1 is a block diagram of a memory system including memory devices according to some embodiments of the inventive concepts.

The present inventive concepts will now be described more fully with reference to the accompanying drawings, in which exemplary embodiments of the inventive concepts are shown. The inventive concepts may, however, be embodied in many different forms, and should not be construed as being limited to the embodiments set forth herein. Thus, the inventive concepts may include all revisions, equivalents, or substitutions which are included in the concept and the technical scope related to the present inventive concepts. Like reference numerals in the drawings denote like elements. In the drawings, the dimension of structures may be exaggerated for clarity.

The terms used in the present specification are merely used to describe particular embodiments, and are not intended to limit the inventive concepts. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

While terms "first" and "second" are used to describe various components, the components are not limited to the terms "first" and "second". The terms "first" and "second" are used only to distinguish between each component. For example, a first component may indicate a second component or a second component may indicate a first component without conflicting with the inventive concepts.

Unless defined otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly defined otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a memory system 10 including a memory device 100 according to some embodiments of the inventive concepts.

Referring to FIG. 1, the memory system 10 may include a memory device 100 and a memory controller 101. The memory device 100 may include multiple layers that are vertically stacked, and the multiple layers may include a memory cell array 110, a write/read circuit 120, and a control logic 130. For example, the memory device 100 may include at least one cell layer in which the memory cell array 110 is disposed, and a control layer in which various circuits for memory operations are disposed. Each cell layer may include the memory cell array 110 illustrated in FIG. 1, and the control layer may include the write/read circuit 120, the control logic 130, and various peripheral circuits illustrated in FIG. 1.

Each cell layer may have a cross point array structure in which memory cells are disposed between upper electrodes formed of a plurality of first lines and lower electrodes formed of a plurality of second lines. Accordingly, the memory cell array 110 of each cell layer may include multiple memory cells arranged in a matrix. Also, as the memory cell array 110 includes resistive memory cells, the memory device 100 may be referred to as a resistive memory device, and the memory system 100 may be referred to as a resistive memory system. Hereinafter, although embodiments of the inventive concepts will be described based on a resistive memory device, the embodiments of the inventive concepts may also be applied to various types of memory devices having the above-described cross point array structure.

Also, although each cell layer is described as including the memory cell array 110, the term may be defined in various manners according to embodiments of the inventive concepts. For example, the memory cell array 110 of FIG. 1 may also be defined as a concept including memory cells arranged in multiple cell layers.

In response to a write/read request from a host, the memory controller 101 may control the memory device 100 such that data stored in the memory device 100 is read or data is written to the memory device 100. In detail, the memory controller 101 may provide the memory device 100 with an address ADDR, a command CMD, and a control signal CTRL and thus may control a programming (or write) operation, a read operation, and an erase operation on the memory device 100. Also, data DATA to be written and read data DATA may be transmitted or received between the memory controller 101 and the memory device 100.

The memory controller 101 may include a Random Access Memory (RAM), a processing unit, a host interface, and a memory interface. The RAM may be used as an operation memory of the processing unit. The processing unit may control operations of the memory controller 101. The host interface may include a protocol for exchanging data between the host and the memory controller 101. For example, the memory controller 101 may communicate with the host by using at least one of various interface protocols including USB, MMC, PCI-E, Advanced Technology Attachment (ATA), Serial-ATA, Parallel-ATA, SCSI, ESDI, and Integrated Drive Electronics (IDE).

The memory cell array 110 disposed in each cell layer may include a plurality of memory cells that are respectively disposed in regions where a plurality of first signal lines and a plurality of second signal lines cross. According to some embodiments, the first signal lines may be bit lines, and the second signal lines may be word lines. According to other embodiments, the first signal lines may be word lines, and the second signal lines may be bit lines. Word lines and bit lines may be generally referred to herein as selection lines.

In the present embodiment, each of the memory cells may be a single level cell (SLC) that stores one bit data, or may be a multilevel cell (MLC) that may store at least two-bit data. In some embodiments, the memory cell array 110 may include both the SLC and the MLC. For example, in a resistive memory, when one bit data is written to one memory cell, the memory cells may have two resistance level distributions according to the written data. In some embodiments, when two-bit data is written to one memory cell, the memory cells may have four resistance level distributions according to the written data. In other embodiments, if a memory cell is a triple level cell (TLC) that stores three-bit data, the memory cells may have eight resistance level distributions according to the written data. However, embodiments of the inventive concepts are not limited thereto. Thus, in other embodiments, each of the memory cells may store at least four-bit data.

The memory cell array 110 may include resistance-type memory cells or resistive memory cells that include a variable resistor device having a variable resistor. For one example, when resistance of the variable resistor device that is formed of a phase change material (e.g., Ge—Sb—Te) is changed according to a temperature, a resistive memory device may be a Phase change RAM (PRAM). For another example, when the variable resistor device is formed of an upper electrode, a lower electrode, and a transition metal oxide (complex metal oxide) therebetween, the resistive memory device may be a Resistive RAM (RRAM). For another example, when the variable resistor device is formed of an upper electrode of a magnetic material, a lower electrode of a magnetic material, and a dielectric therebetween, the resistive memory device may be a Magnetic RAM (MRAM).

The write/read circuit 120 performs write and read operations on the memory cells. The write/read circuit 120 is connected to the memory cells via multiple bit lines, and may include a write driver that writes data to the memory cells and a sense amplifier that amplifies data read from the memory cells.

The control logic 130 may generally control the operations of the memory device 100, and may control the write/read circuit 120 to perform memory operations such as a write operation or a read operation. For example, to perform a write and read operation on the memory device 100, the control logic 130 may control such that various voltage signals are provided to the write/read circuit 120. For example, a power generating unit may be further included in the memory device 100, which generates bias voltages for biasing non-selected memory cells at the same time when generating a write voltage (or a write current) or a read voltage (or a read current) provided to a selected memory cell, and the write/read circuit 120 performs memory operations by using various voltage signals under the control of the control logic 130.

In a write operation on the memory device 100, variable resistance of a memory cell may increase or be reduced according to written data. For example, each of memory cells of the memory cell array 110 may have a resistance value according to currently stored data, and the resistance value of the memory cell array 110 may increase or be reduced according to data that is to be written to each of the memory cells. A write operation as described above may be classified as a reset write operation and a set write operation. A set state in a resistive memory cell may have a relatively low resistance value, whereas a reset state may have a relatively high resistance value. In a reset write operation, a write operation is performed in a direction in which variable resistance increases, and in a set write operation, a write operation is performed in a direction in which variable resistance is reduced.

In regard to a write operation and a read operation on the memory cell array 110, memory cells that are to be accessed and memory cells that are not to be accessed need to be electrically separated, and to this end, appropriate line biasing on first and second lines is required. For example, a selection voltage may be provided to first and second lines connected to memory cells to be accessed (e.g., selected lines), whereas an inhibit voltage may be provided to other word lines and bit lines so that other memory cells are not selected.

According to some embodiments of the inventive concepts, in the memory device 100 having a cross point array structure in which multiple layers are vertically stacked, memory cells are accessed according to an improved or optimized addressing order. For example, memory cells of multiple cell layers may be classified into multiple tiles. The tiles may be defined in various ways. For example, a tile may be defined as a unit that includes memory cells disposed in an area where multiple word lines that share a same row selecting unit and multiple bit lines that share a same column selecting unit cross each other in each layer. Also, the tile may be defined as a unit including memory cells of multiple cell layers.

According to some embodiments, addressing for a memory access operation may be set based on a tile unit. For example, when the memory device 100 includes first through Nth tiles, addressing order may be controlled such that memory cells included in any One tile are accessed, and then memory cells included in another tile are accessed. When the memory device 100 includes A cell layers, each tile may include memory cells included in the A layers, and after memory cells disposed in the A layers of a tile are accessed, memory cells disposed in A layers in another tile may be accessed. That is, according to some embodiments of the inventive concepts, instead of accessing all of memory cells disposed in a cell layer and then accessing memory cells in another cell layer, memory cells of multiple cell layers are classified into multiple tiles, and addressing may be set based on the classified tiles in regard to accessing the memory cells.

According to some embodiments of the inventive concepts, a biasing time may be reduced in the memory device 100 having a cross point array structure that requires inhibit biasing on non-selected memory cells. Also, as positions of selected memory cells (for example, positions of layers) are varied, biasing conditions of multiple lines (for example, word lines and bit lines) are varied. However, according to some embodiments of the inventive concepts, power consumption due to accessing of memory cells may be reduced overall by reducing a frequency of a change of a voltage level applied to the multiple lines.

The memory controller 101 and the memory device 100 may be integrated to a semiconductor device. For example, the memory controller 101 and the memory device 100 may be integrated to a semiconductor device and thus may configure or define a memory card. For example, the memory controller 101 and the memory device 100 may be integrated to a semiconductor device and thus may configure a PC card (a PCMCIA card), a compact flash card (CF card), a smart media card (SM/SMC), a memory stick, a multimedia card (MMC, RS-MMC, or MMCmicro, an SD card (SD, miniSD, or microSD), or a universal flash storage (UFS). For another example, the memory controller 101 and the memory device 100 may be integrated to a semiconductor device and thus may configure a Solid State Disk/Drive (SSD).

Meanwhile, according to some embodiments of the inventive concepts, when accessing memory cells of multiple layers included in each tile, an order of layers that are accessed within a tile may be set arbitrarily or according to predetermined conditions. Also, according to other embodiments, each tile may be divided into at least two regions, and after memory cells of a region of a tile (for example, a first tile) are accessed, memory cells of another tile may be accessed. Thereafter, memory cells of the rest of regions of the first tile may be accessed.

Also, according to other embodiments, at least two tiles may be defined as a tile group, and addressing for accessing memory cells may be set based on the tile group. For example, after memory cells of a tile group (for example, a firs tile group) are accessed, memory cells of another tile group may be accessed. An operation of the memory device 100 which may be modified in various manners according to embodiments of the inventive concepts will be described later.

Figure 2:
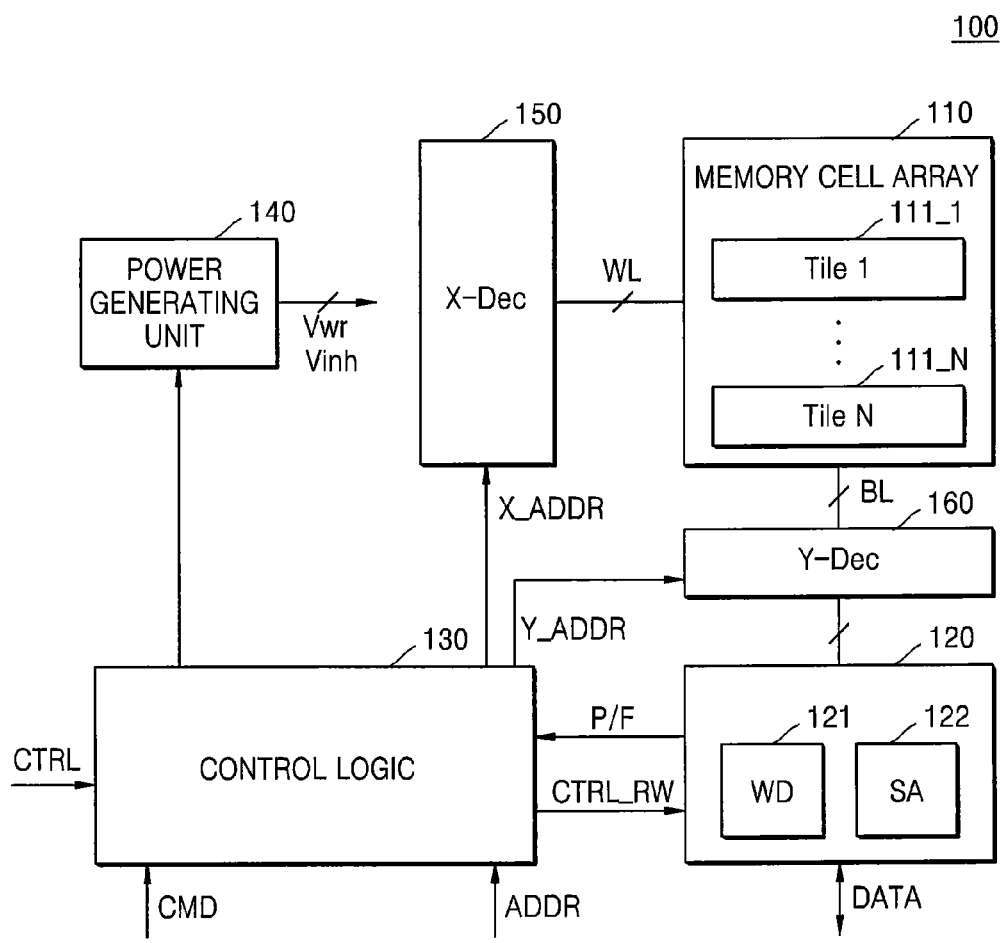
FIG. 2 is a block diagram of the memory device of FIG. 1, according to some embodiments of the inventive concepts.

An operation of the memory device 100 included in the memory system 10 with the aforementioned structure will be described below. FIG. 2 is a block diagram of the memory device 100 of FIG. 1, according to some embodiments of the inventive concepts.

Referring to FIG. 2, the memory device 100 may include the memory cell array 110, the write/read circuit 120, and the control logic 130. Also, the memory device 100 may further include a power generating unit 140, a row decoder 150, and a column decoder 160. Also, the write/read circuit 120 may include a write driver 121 and a sense amp 122. Also, the memory device 100 may include multiple layers that are vertically stacked, and the multiple layers may include a control layer and multiple cell layers. Also, memory cells included in the memory cell array 110 may be classified as a first tile 111_1 through an Nth tile 111_N.

A structure and an operation of the memory device 100 illustrated in FIG. 2 are as described below.

Memory cells included in the memory cell array 110 may be connected to a plurality of first lines (or a plurality of first signal lines) and a plurality of second lines (or a plurality of second signal lines). The plurality of first lines may be word lines WL, and the plurality of second lines may be bit lines BL. As various voltage signals or current signals are provided through a plurality of word lines WL and a plurality of bit lines BL (hereinafter, a signal provided to lines of the memory cell array 110 is defined as a voltage signal), data may be written to or read from some selected memory cells, and non-selected memory cells may be prevented from being written to or read from.

Meanwhile, an address ADDR for indicating a memory cell to be accessed may be received with a command CMD, and the address ADDR may include a row address X_ADDR for selecting word lines WL of the memory cell array 110 and a column address Y_ADDR for selecting bit lines BL of the memory cell array 110. The row decoder 150 performs a word line selecting operation in response to a row address X_ADDR, and the column decoder 160 performs a bit line selecting operation in response to a column address Y_ADDR.

The write/read circuit 120 may be connected to the bit lines BL to write data to a memory cell or read data from a memory cell. For example, the write/read circuit 120 may receive a write/read voltage Vwr from the power generating unit 140, and the write driver 121 may provide the memory cell array 110 with a received write voltage via the column decoder 160. In a set write operation, the write driver 121 may reduce a resistance value of variable resistance of a memory cell by providing the memory cell array 110 with a set voltage. In addition, in a reset write operation, the write driver 121 may increase a resistance value of variable resistance of a memory cell by providing the memory cell array 110 with a reset voltage.

Meanwhile, in a data read operation, the write/read circuit 120 may provide a read voltage to a memory cell. Also, to determine data, the sense amp 122 may include a comparing unit that is connected to a node of a bit line (for example, a sensing node). An end of the comparing unit may be connected to a sensing node, and the other end thereof may be connected to a reference voltage source so that data may be determined. Also, the write/read circuit 120 may provide the control logic 130 with a pass/fail signal P/F according to a result of determining read data. The control logic 130 may control a write operation and a read operation of the memory cell array 110 by referring to the pass/fail signal P/F.

The control logic 130 may output various control signals CTRL_RW for writing data to the memory cell array 110 or reading data from the memory cell array 110 based on a command CMD, an address ADDR, and a control logic CTRL received from the memory controller 120. Accordingly, the control logic 130 may control various operations in the memory device 100 overall.

First through Nth tiles (111_1 through 111_N) may each include memory cells disposed in multiple layers, and according to some embodiments of the inventive concepts, addressing may be set based on the defined tiles when accessing the memory cells. Also, as addressing is set based on the tiles in the memory device 100, positions of memory cells that are requested to be accessed by an external device (for example, a host) and positions of memory cells that are actually accessed by the memory device 100 may be different. Here, an address provided by a host may be referred to as a logical address, and an address indicating a memory to be actually accessed may be referred to as a physical address.

The memory controller 101 of FIG. 1 may convert a logical address from the host to a physical address and provide the memory device 100 with the physical address as an address ADDR illustrated in FIG. 2. According to other embodiments, the memory controller 101 may provide the memory device 100 with a logical address from the host, and the memory device 100 may convert the logical address to a physical address and output a row address X_ADDR and a column address Y_ADDR corresponding to the converted physical address.

Figure 3A:
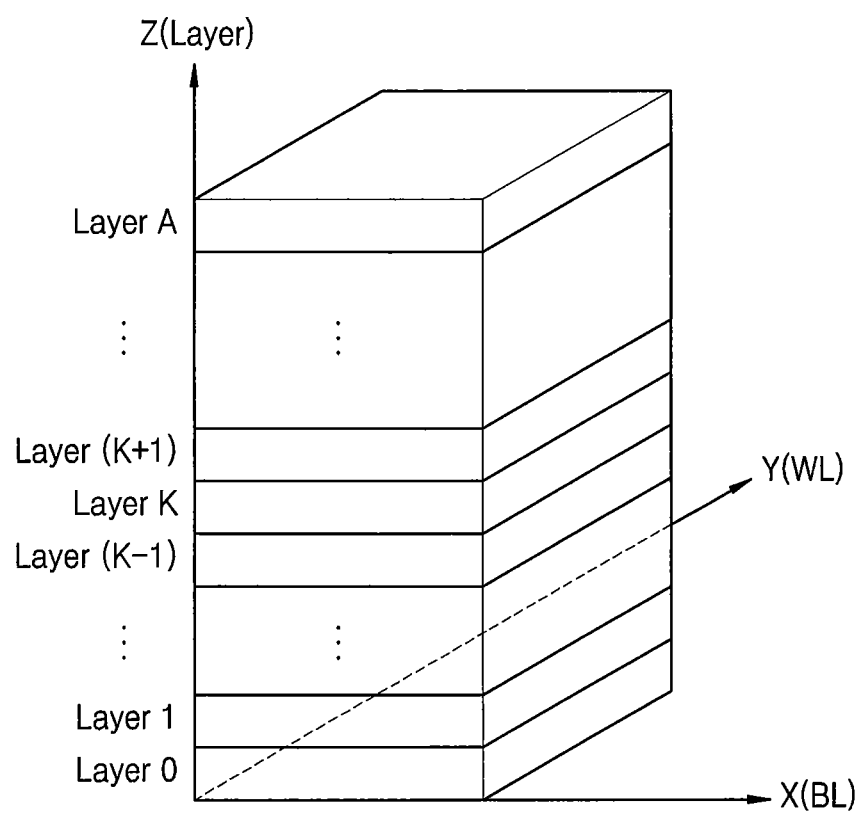
FIGS. 3A through 3D are a structural diagram and a circuit diagram of the memory device of FIG. 2, according to some embodiments of the inventive concepts.
Figure 3B:
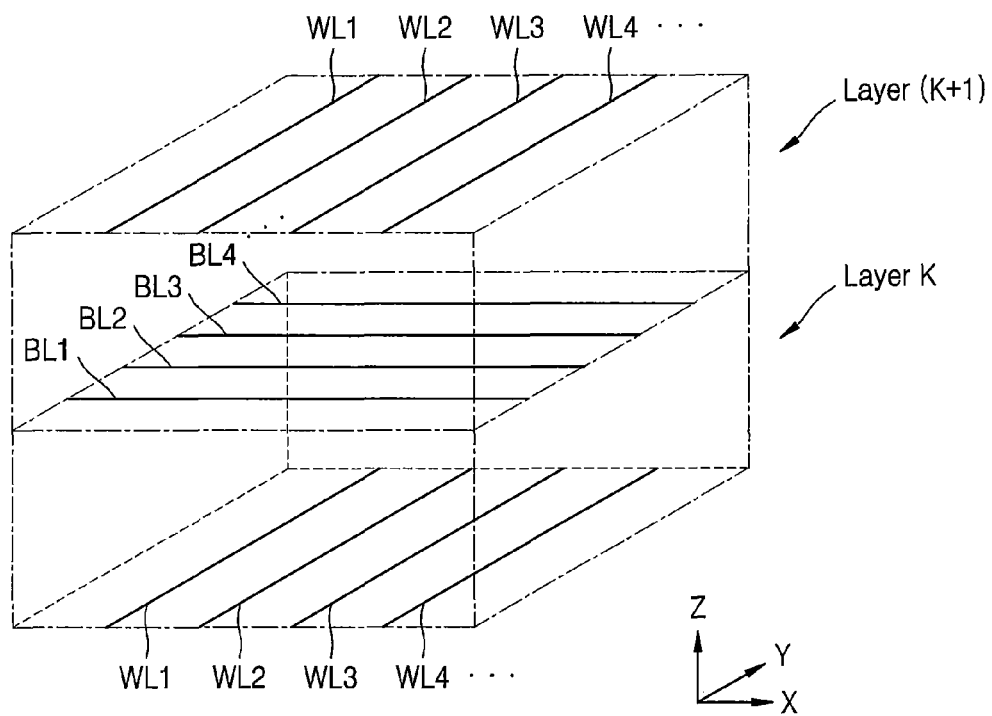
Figure 3C:
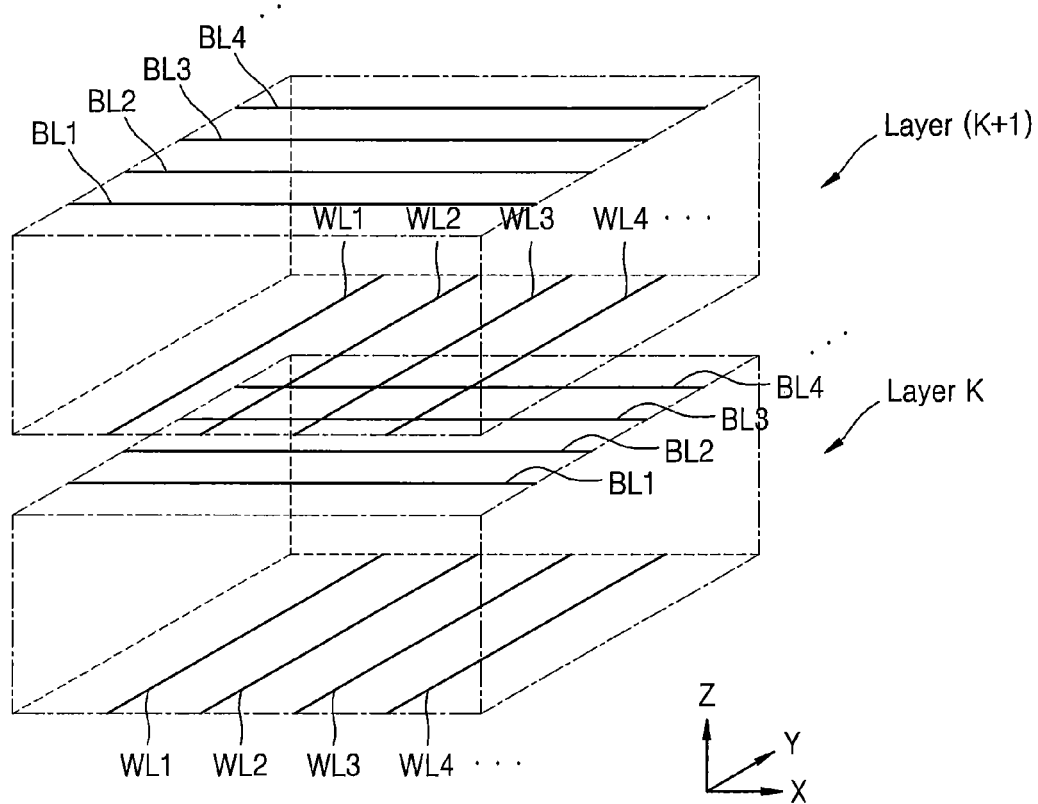
Figure 3D:
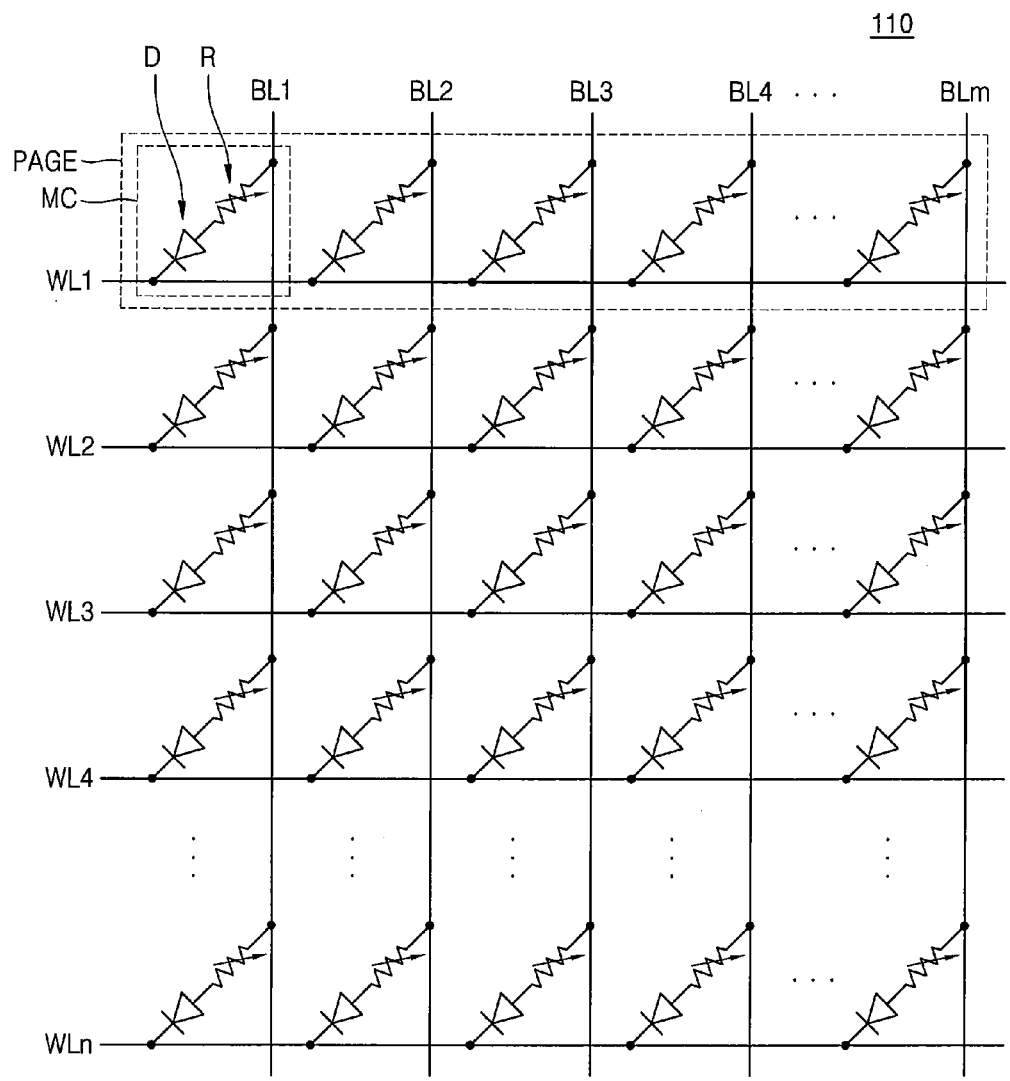

FIGS. 3A through 3D are a structural diagram and a circuit diagram of the memory device 100 of FIG. 2, according to some embodiments of the inventive concepts. FIG. 3A is a structural diagram illustrating the general structure of the memory device 100, and FIGS. 3B and 3C are structural diagrams illustrating arrangement of word lines and bit lines of cell layers, and FIG. 3D is a circuit diagram of the memory cell array 110.

Referring to FIG. 3A, the memory device 100 has a three-dimensional structure, and includes two-dimensional memory layers on a X-Y plane, which are stacked in a Z-axis direction. According to the present embodiment, a total of A+1 layers, from a lowermost layer (Layer 0) through an uppermost layer (Layer A) are illustrated. An X-axis may be a wiring direction of bit lines BL included in a cell region, a Y-axis may be a wiring direction of word lines WL included in the cell region, and a Z-axis may be a stacking direction of layers (Layer 0 through Layer A). According to some embodiments, the lowermost layer (Layer 0) may be a control layer in which a control region is disposed, and the rest of layers (Layer 1 through Layer A) may be cell layers in which memory cells are disposed.

Meanwhile, as illustrated in FIG. 3B, a plurality of word lines WL0, WL1, WL2, and WL3 and a plurality of bit lines BL0, BL1, BL2, and BL3 may be respectively disposed on a lower surface and an upper surface of a layer (for example, a Kth layer) to orthogonally cross each other when they are projected onto a X-Y plane, and may be alternately disposed along a stacking direction of the cell layers (Z-axis direction). According to some embodiments, a plurality of word lines WL0, WL1, WL2, and WL3 and a plurality of bit lines BL0, BL1, BL2, and BL3 disposed in the Kth layer (Layer K) may be shared by other layers (for example, a (K−1)th layer and a (K+1)th layer).

Meanwhile, referring to FIG. 3C, each layer may include word lines WL0, WL1, WL2, and WL3 and bit lines BL0, BL1, BL2, and BL3 without sharing a line with other layers. For example, a plurality of word lines WL0, WL1, WL2, and WL3 and a plurality of bit lines BL0, BL1, BL2, and BL3 are respectively disposed in a Kth layer (Layer K), and in the same direction as the above word lines and the above bit lines, a plurality of word lines WL0, WL1, WL2, and WL3 and a plurality of bit lines BL0, BL1, BL2, and BL3 may also be disposed on a K+1th layer (Layer K+1).

Referring to FIG. 3D the memory cell array 110 included in each cell layer may be a horizontal two-dimensional memory, and may include a plurality of word lines WL1 through WLn, a plurality of bit lines BL1 through BLm, and a plurality of memory cells MC. The number of the word lines WL, the bit lines BL, and the memory cells MC may be modified according to embodiments. Also, a set of memory cells that may be accessed simultaneously by the same word line may be defined as a page.

According to some embodiments, each of the plurality of memory cells MC may include a variable resistor device R and a selection device D. The variable resistor device R may be referred to as a variable resistance material, and the selection device D may be referred to as a switching device.

According to some embodiments, the variable resistor device R is connected between one of a plurality of bit lines BL1 through BLm and the selection device D, and the selection device D may be connected between the variable resistor device R and one of a plurality of word lines WL1 through WLn. However, embodiments of the inventive concepts are not limited thereto, and the selection device D may be connected between one of a plurality of bit lines BL1 through BLm and the variable resistor device R, and the variable resistor device R may be connected between the selection device D and one of a plurality of word lines WL1 through WLn.

The selection device D may be connected between one of the plurality of word lines WL1 through WLn and the variable resistor device R, and may control a current supply to the variable resistor device R according to a voltage applied to the connected word line and bit line. While a diode is illustrated as the selection device D in FIG. 3, this is merely an example embodiment of the inventive concepts, and according to other embodiments, the selection device D may be modified to other switchable devices.

Figure 4A:
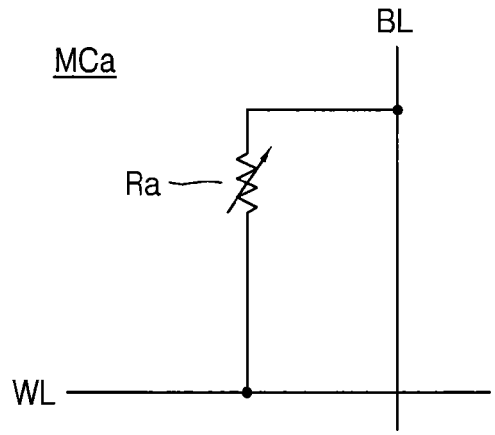
FIGS. 4A through 4C are circuit diagrams illustrating examples of a memory cell included in the memory device of FIG. 1.
Figure 4B:
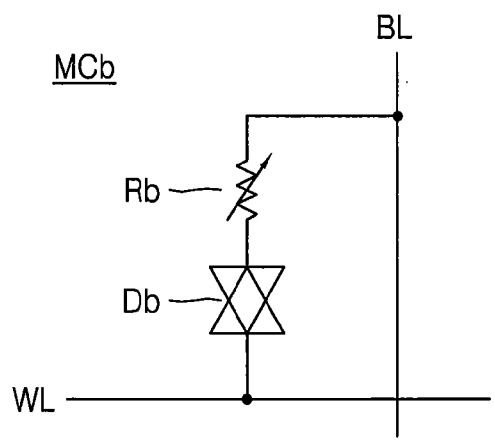
Figure 4C:
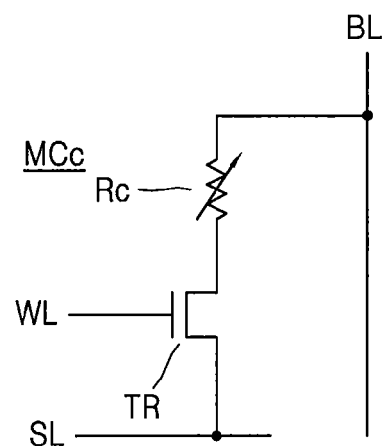

FIGS. 4A through 4C are circuit diagrams illustrating examples of a memory cell included in the memory device 100 of FIG. 1.

Referring to FIG. 4A, a memory cell MCa may include a variable resistor device Ra that may be connected between a bit line BL and a word line WL. The memory cell MCa may store data due to voltages that are respectively applied to the bit line BL and the word line WL.

Referring to FIG. 4B, a memory cell MCb may include a variable resistor device Rb and a bidirectional diode Db. The variable resistor device Rb may include a resistive material so as to store data. The bidirectional diode Db may be connected between the variable resistor device Rb and a word line WL, and the variable resistor device Rb may be connected between a bit line BL and the bidirectional diode Db. Positions of the bidirectional diode Db and the variable resistor device Rb may be changed with respect to each other. By using the bidirectional diode Db, a leakage current that may flow to a non-selected resistor cell may be reduced.

Referring to FIG. 4C, a memory cell MCc may include a variable resistor device Re and a transistor TR. The transistor TR may be a selection device that supplies or blocks a current to the variable resistor device Re according to a voltage of the word line WL, that is, a switching device. According to the embodiment of FIG. 4C, in addition to the word line WL, a source line SL for adjusting voltage levels of two ends of the variable resistor device Rc may be additionally included. The transistor TR may be connected between the variable resistor device Rc and the source line SL, and the variable resistor device R may be connected between a bit line BL and the transistor TR. Positions of the transistor TR and the variable resistor device Rc may be changed with respect to each other. The memory cell MCc may be selected or not selected according to ON or OFF states of the transistor TR that is driven by the word line WL.

Figures 5A, 5B:
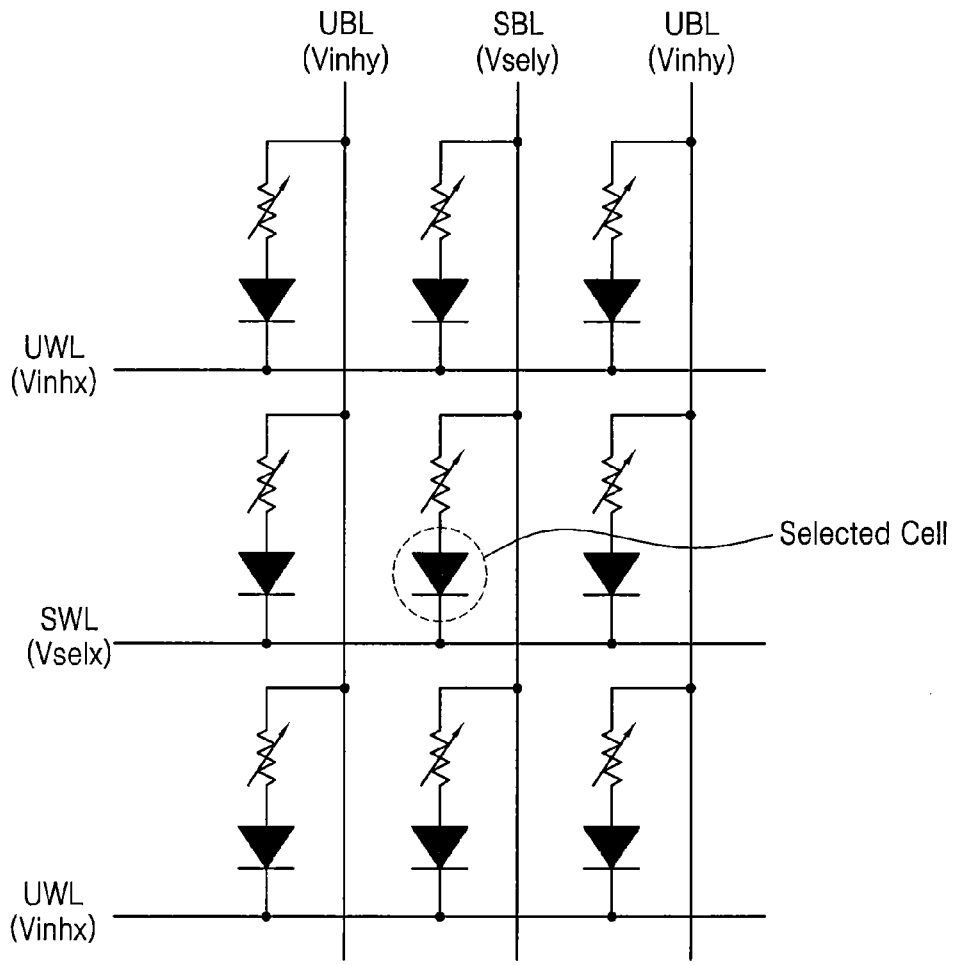
FIGS. 5A and 5B are a circuit diagram and a table showing an example of a voltage provided to word lines and bit lines in memory operations.

FIGS. 5A and 5B are a circuit diagram and a table, respectively, showing an example of a voltage provided to word lines and bit lines in a memory operation.

As illustrated in FIG. 5A, in order to change a resistance value of a variable resistor device of a selected memory cell in a write operation, various voltages may be provided to word lines and bit lines. For example, a first selection voltage Vsely may be applied to a bit line SBL of a selected memory cell, and a first inhibit voltage Vinhy may be applied to a bit line UBL of a non-selected memory cell. Also, a second selection voltage Vselx may be applied to a word line SWL of a selected memory cell, and a second inhibit voltage Vinhx may be applied to a word line UWL of a non-selected memory cell.

Meanwhile, as illustrated in FIG. 5B, in a set write operation for reducing a resistance value of a variable resistor device, a relatively high voltage, for example, a first selection voltage Vsely of 4 V may be provided to a bit line SBL of a selected memory cell. Also, various inhibit voltages may be provided to a non-selected memory cell, and for example, a first inhibit voltage Vinhy of 1 V and a second inhibit voltage Vinhx of 3 V may be provided. Also, a voltage of 0 V may be applied to a word line SWL of a selected memory cell.

Meanwhile, in a reset write operation for increasing a resistance value of a variable resistor device, a relatively low voltage, for example, a first selection voltage Vsely of 0 V may be provided to a bit line SBL of a selected memory cell, and a relatively high voltage, for example, a second selection voltage Vselx of 5 V may be applied to a word line SWL of the selected memory cell. Also, various inhibit voltages may be provided to a non-selected memory cell, and for example, a first inhibit voltage Vinhy of 3 V and a second inhibit voltage Vinhx of 2 V may be provided.

Also, a read voltage Vread for reading data stored in a memory cell may be provided to a bit line SBL of a selected memory cell, and various inhibit voltages such as a first inhibit voltage Vinhy of 0.5 V and a second inhibit voltage Vinhx of 2 V may be provided to a non-selected memory cell.

Figure 6:
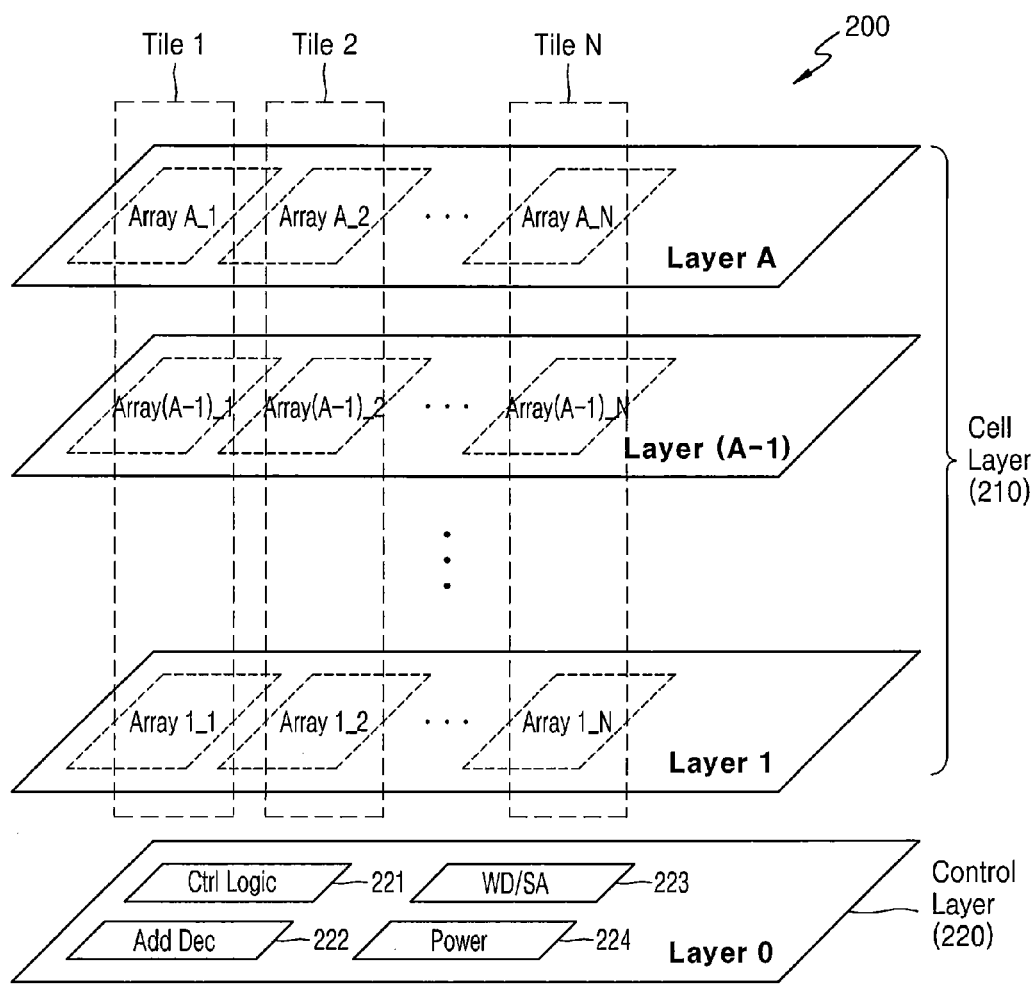
FIG. 6 illustrates memory devices including multiple layers according to some embodiments of the inventive concepts.

FIG. 6 illustrates a memory device 200 including multiple layers according to some embodiments of the inventive concepts. The memory device 200 includes multiple layers that are vertically stacked, and it is assumed that, for example, a lowermost layer (Layer 0) corresponds a control layer 220, and the rest of layers (Layer 1 through Layer A) correspond to cell layers 210.

The control layer 220 may include a control logic 221, an address decoder 222, a write/read circuit 223, and a power generating unit 224. The control logic 221 may control an overall operation of the memory device 200 including memory operations, and the address decoder 222 may decode an address from the outside to output the decoded address. The decoded address may include a row address for selecting word lines WL of a cell array and a column address for selecting bit line BL of the cell array. Meanwhile, in the same or similar manner as described above, the write/read circuit 223 performs a write and read operation on the cell layers 210, and also, the power generating unit 224 may generate various power signals including a selection voltage and an inhibit voltage related to memory operations.

Meanwhile, each layer of the cell layers 210 includes a memory cell array. In other words, the memory cell array of the memory device 200 may be described as including memory cells of the multiple cell layers 210. That is, the memory cell array 110 illustrated in FIG. 1 may refer to memory cells disposed in a cell layer or memory cells disposed in multiple cell layers.

The cell layers 210 may each include multiple cell regions; for example, first through Nth array regions. As illustrated in FIG. 6, a first layer (Layer 1) may include first through Nth array regions (Array 1_1 through Array 1_N), and also, an Ath layer (Layer A) may include first through Nth array regions (Array A_1 through Array A_N). Each array region may have a structure in which multiple word lines share the same row selecting unit and multiple bit lines share the same column selecting unit. That is, in a two-dimensional memory cell array, each array region may be defined as a tile. Also, in a three-dimensional memory cell array, a tile may be defined as a unit that includes array regions of multiple cell layers.

As described above, a tile in a layer may be defined in various manners. For example, word lines connected to memory cells of a tile may share the same row selecting unit, and also, bit lines connected to memory cells may share the same column selecting unit. That is, word lines and/or bit lines may be separated according to tiles. Accordingly, memory cells belonging to different tiles may be simultaneously accessed.

As illustrated in FIG. 6, the cell layers 210 may include multiple (for example N) tiles (Tile 1 through Tile N). The N tiles (Tile 1 through Tile N) may each include memory cells disposed in A cell layers 210. According to some embodiments of the inventive concepts, an addressing order for accessing memory cells may be set based on a tile unit. For example, addressing may be performed such that after memory cells of at least two layers of a first tile are accessed, memory cells disposed in a layer of another tile are accessed. According to some embodiments, after all memory cells included in a first tile (Tile 1) are accessed, memory cells included in a second tile (Tile 2) may be accessed. According to other embodiments, the first tile (Tile 1) may be divided into at least two regions, and after all memory cells included in a region of the first tile (Tile 1) are accessed, memory cells included in the second tile (Tile 2) may be accessed.

According to other embodiments, the first tile (Tile 1) and the second tile (Tile 2) may be defined as one tile group, and after at least some memory cells of the first tile (Tile 1) and the second tile (Tile 2) are accessed, memory cells included in another tile group may be accessed.

Figures 7A, 7B:
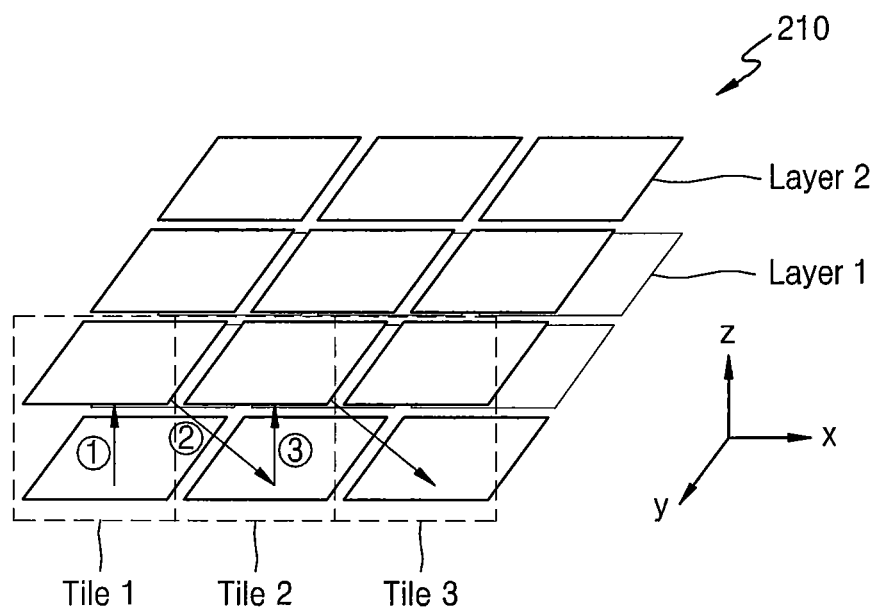
FIGS. 7A and 7B illustrate an addressing order and an addressing signal according to the addressing order according to some embodiments of the inventive concepts.

FIGS. 7A and 7B illustrate an addressing order and an addressing signal according to the addressing order according to some embodiments of the inventive concepts. For convenience of description, two layers (Layer 1 and Layer 2) are illustrated in FIGS. 7A and 7B. Also, although a data write operation is illustrated as a memory operation in FIGS. 7A and 7B, a data reading operation may also be performed in the same or similar addressing order illustrated in FIGS. 7A and 7B.

As illustrated in FIG. 7A, data including multiple bits may be written to the cell layers 210. Along with data, addresses A19 through A28 indicating data storage positions may also be provided to the memory device. As illustrated in FIG. 7B, an address including multiple bits (for example, 10 bits) may be provided, and some lower bits of the address may indicate a position of a layer of a memory cell that is accessed, and some upper bits of the address may indicate a position of a tile in which the memory cell that is accessed is included. As a bit value of the address is counted, values of some lower bits of the address are changed, and accordingly, the position of the layer of the memory cell that is accessed may be changed first. Then, values of some upper bits of the address are changed, and accordingly, the position of the tile of the memory cell that is accessed may be changed.

Accessing of memory cells may be performed according to the address. For example, as illustrated in FIG. 7A, after memory cells of a first layer (Layer 1) of the first tile (Tile 1) are accessed, memory cells of a second layer (Layer 2) of the first tile (Tile 1) may be accessed. Thereafter, memory cells of the first layer (Layer 1) and memory cells of the second layer (Layer 2) of the second tile (Tile 2) may be sequentially accessed, and then memory cells of a first layer (Layer 1) and memory cells of a second layer (Layer 2) of a third tile (Tile 3) may be sequentially accessed. In this manner, memory cells of all tiles included in the cell layers 210 may be accessed.

Figure 8A:
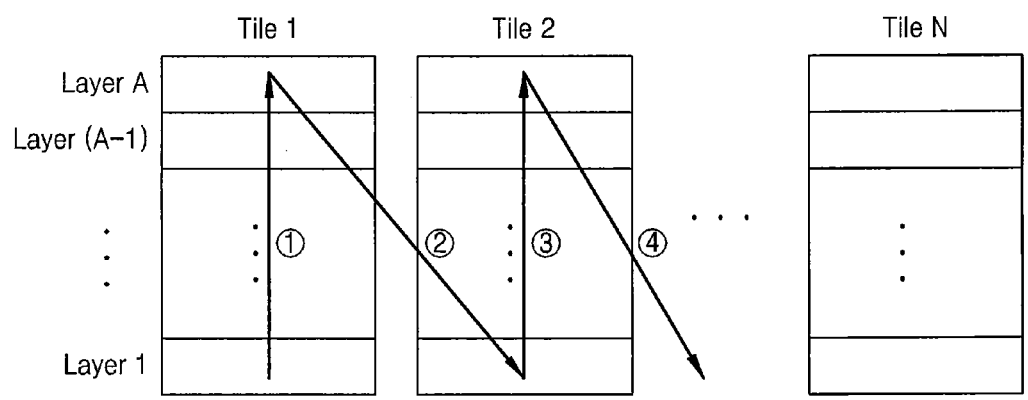
FIGS. 8A, 8B, and 8C illustrate various examples of an addressing order according to some embodiments of the inventive concepts.
Figure 8B:
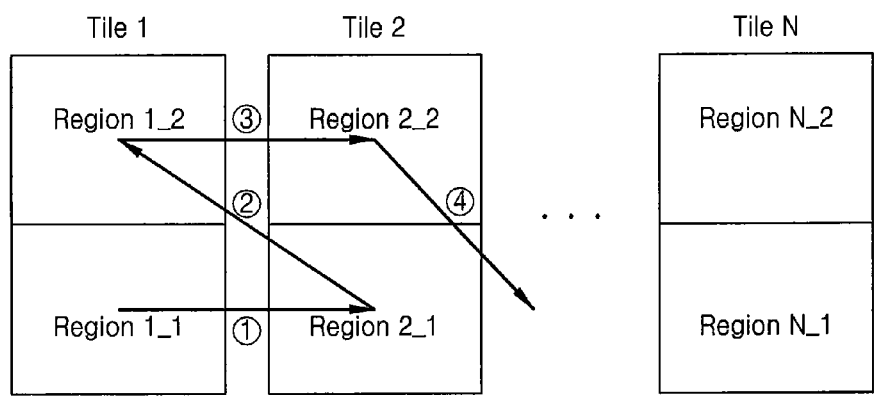
Figure 8C:
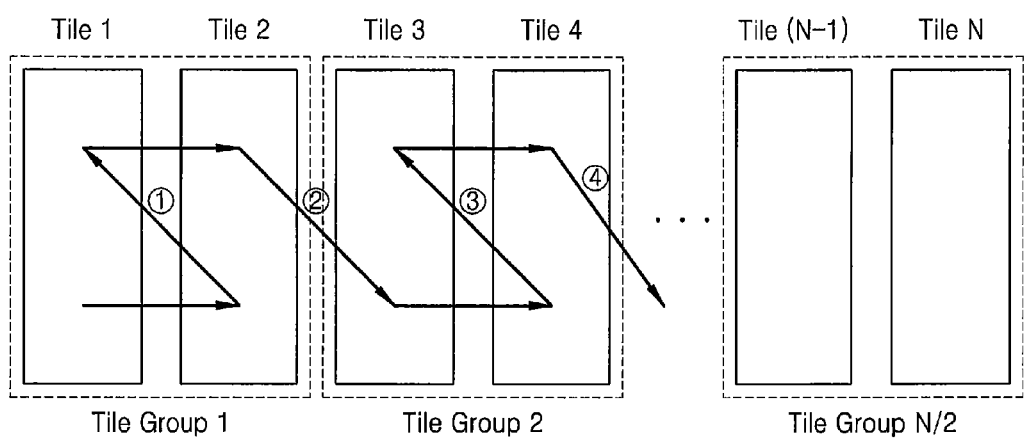

FIGS. 8A, 8B, and 8C illustrate various examples of an addressing order according to some embodiments of the inventive concepts.

A memory device may include multiple cell layers (Layer 1 through Layer A), and the multiple cell layers may include first through Nth tiles (Tile 1 through Tile N). As a request for accessing data including multiple bits is received, multiple memory cells included in the first through Nth tiles (Tile 1 through Tile N) may be accessed, and memory cells may be accessed based on various addressing orders according to some embodiments of the inventive concepts.

According to some embodiments, as illustrated in FIG. 8A, memory cells of multiple layers included in a tile (for example, a first tile) are accessed, and memory cells of all layers of, for example, the first tile (Tile 1) may be accessed. After the memory cells of all layers of the first tile (Tile 1) are accessed, then, according to an addressing order, for example, a second tile (Tile 2) may be selected as another tile. As the second tile (Tile 2) is selected, memory cells of all layers of the second tile (Tile 2) may be accessed, and according to an addressing order, for example, a third tile (Tile 3) may be selected as another tile. Memory cells of the first through Nth tiles (Tile 1 through Tile N) may be accessed according to the above order.

According to other embodiments, as illustrated in FIG. 8B, each of the first through Nth tiles (Tile 1 through Tile N) may be divided into two regions. For example, the first tile (Tile 1) may include a first region (Region 1_1) and a second region (Region 1_2). Similarly, the Nth tile (Tile N) may include a first region (Region N_1) and a second region (Region N_2). Each region may include multiple layers.

Upon receiving a request for accessing data including multiple bits, first, the first region (Region 1_1) of the first tile (Tile 1) is selected so that memory cells included in the first region (Region 1_1) are accessed. After memory cells of all layers of the first region (Region 1_1) of the first tile (Tile 1) are accessed, the second tile (Tile 2) may be selected. Memory cells included in a region (for example, in a first region (Region 2_1)) of the second tile (Tile 2) are accessed, and after memory cells of all layers of the first region (Region 2_1) of the second tile (Tile 2) are accessed, the first tile (Tile 1) may be selected again. After all layers of the second region (Region 1_2) of the first tile (Tile 1) are accessed, a second region (Region 2_2) of the second tile (Tile 2) may be selected to access memory cells, and then a third tile (Tile 3) may be selected to access memory cells.

According to the embodiment of FIG. 8B, an example in which then the first tile (Tile 1) is selected again after memory cells of the first region (Region 2_1) of the second tile (Tile 2) are accessed, but the present embodiment of the inventive concepts may also be modified in various manners. For example, after memory cells of the first region (Region 2_1) of the second tile (Tile 2) are accessed, not the first tile (Tile 1) is selected again but other tiles may be selected. According to some embodiments, after memory cells of the first regions (Region 1_1 through Region N_1) of the first through Nth tiles (Tile 1 through Tile N) are sequentially accessed, memory cells of the second regions (Region 1_2 through Region N_2) of the first through Nth tiles (Tile 1 through Tile N) may be accessed.

In some embodiments, addressing that is irrelevant to positions of regions may be performed, and for example, after memory cells of the first region (Region 1_1) of the first tile (Tile 1) are accessed, the second region (Region 2_2) of the second tile (Tile 2) may be selected.

Meanwhile, FIG. 8C illustrates some embodiments in regard to addressing according to tile group units; at least two tiles may be defined as a tile group. For example, a first tile group (Tile Group 1) may include first and second tiles (Tile 1 and Tile 2), and a second tile group (Tile Group 2) may include third and fourth tiles (Tile 3 and Tile 4). Similarly, an (N/2)th tile group (Tile Group N/2) may include (N−1)th and Nth tiles (Tile (N−1) and Tile N).

Upon receiving a request for accessing data including multiple bits, a first tile group (Tile Group 1) may be selected to access memory cells included in the first and second tiles (Tile 1 and Tile 2). An access order of memory cells of the first tile (Tile 1) and the second tile (Tile 2) is not needed to be limited, and after memory cells of all layers of the first tile (Tile 1) are accessed, the second tile group (Tile Group 2) may be selected. Accordingly, memory cells of third and fourth tiles (Tile 3 and Tile 4) included in the second tile group (Tile Group 2) may be accessed, and after memory cells of all layers of the second tile group (Tile Group 2) are accessed, a third tile group (Tile Group 3) may be selected.

Figure 9A:
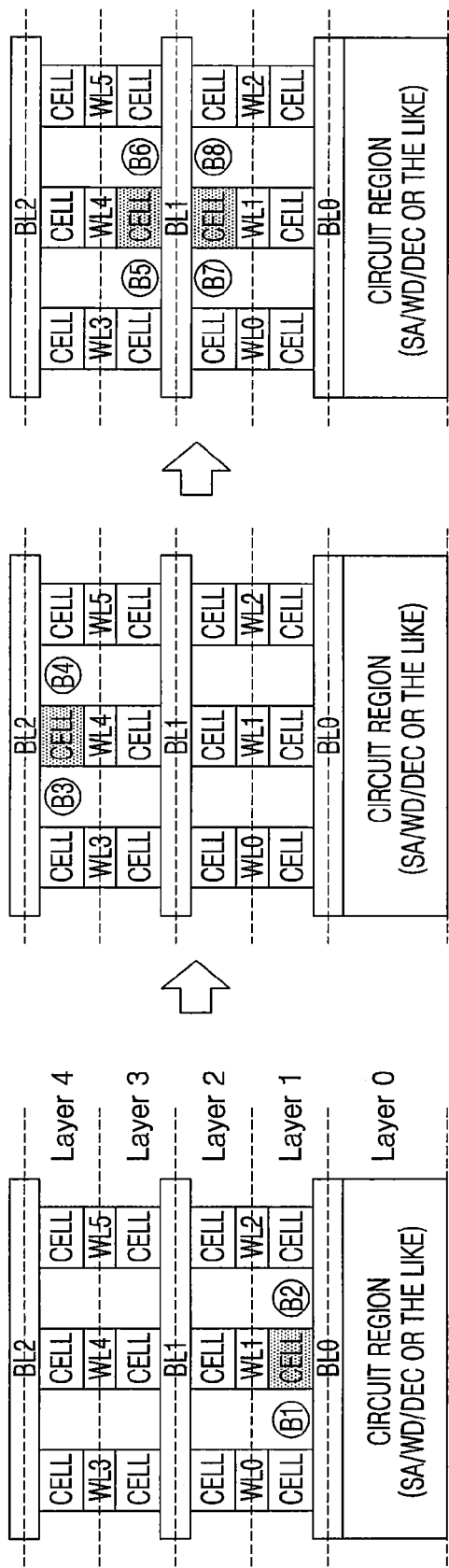
FIGS. 9A and 9B illustrate an access operation on a multilevel cell (MLC)
Figure 9B:
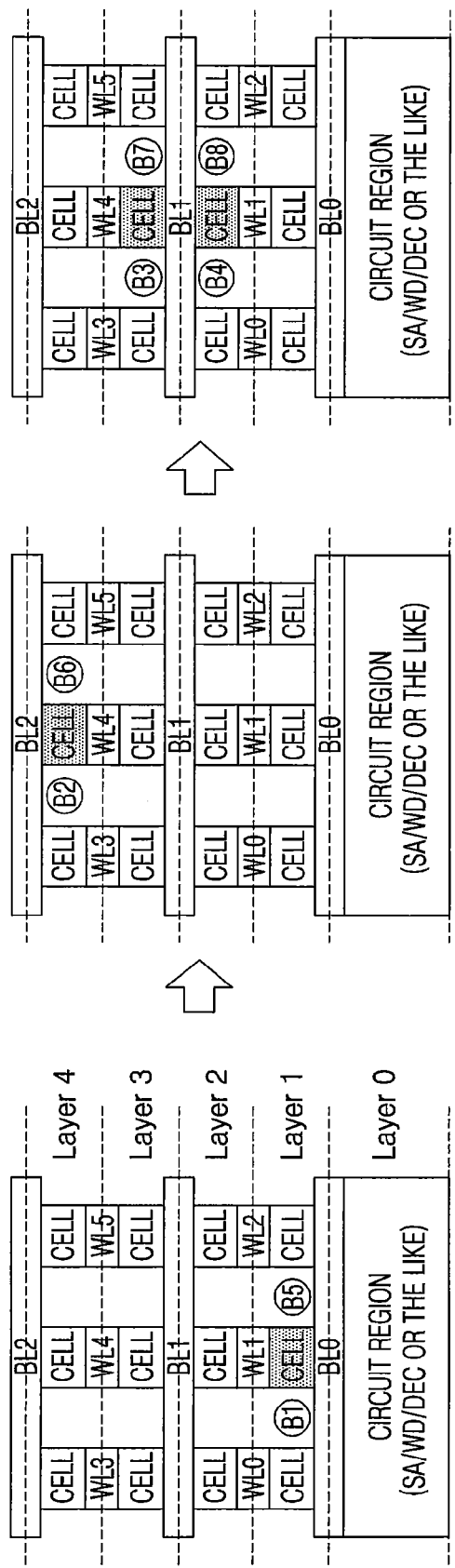

FIGS. 9A and 9B illustrate an access operation on a MLC. Referring to FIGS. 9A and 9B, multiple layers are illustrated as cross-sectional shapes, and also, a MLC that stores 2-bit data is illustrated as a memory cell. However, embodiments of the inventive concepts are not limited thereto, and for example, each memory cell may store data of three or more bits.

A control layer (Layer 0) may include a circuit region that includes a sense amp, a write driver, and a decoder. Also, first through fourth layers (Layer 1 through Layer 4) are illustrated as cell layers in FIGS. 9A and 9B. Also, the layers (Layer 1 through Layer 4) share a word line or a bit line, and for example, a first layer (Layer 1) and a second layer (Layer 2) share word lines WL0 through WL2, and the second layer (Layer 2) and a third layer (Layer 3) share a bit line BL1, and the third layer (Layer 3) and a fourth layer (Layer 4) share word lines WL3 through WL5. Also, each layer structure illustrated in FIGS. 9A and 9B may denote a tile.

In a data write operation, data having multiple bits is written to memory cells. For example, 8-bit data (B1 through B8) may be received and written to memory cells, and as illustrated in FIG. 9A, if any one memory cell is selected, 2-bit data may be consecutively written to the selected memory cell. As a memory cell of the first layer (Layer 1) is selected, first and second data B1 and B2 are written, and then as a memory cell of another cell layer (for example, a fourth layer) is selected, third and fourth data B3 and B4 may be sequentially written. Next, as a memory cell of another cell layer (for example, a third layer) is selected, fifth and sixth data are B5 and B6 sequentially written, and then as a memory cell of another cell layer (for example, a second layer) is selected, seventh and eighth data B7 and B8 may be sequentially written.

According to other embodiments, data having multiple bits may be sequentially written to a memory cell bit by bit in a data write operation. For example, as illustrated in FIG. 9B, as a memory cell of the first layer (Layer 1) is selected, first data B1 may be written, and then as a memory cell of another cell layer (for example, a fourth layer) is selected, second data B2 may be written. Other cell layers (for example, the third layer and the second layer) may be sequentially selected, and third and fourth data B3 and B4 may be sequentially written to selected memory cells.

Next, the rest of data may be written as previously selected memory cells are selected again, and for example, fifth data B5 may be written to a memory cell of the first layer (Layer 1), and then as other cell layers (for example, the fourth layer, the third layer, and the second layer) are sequentially selected, sixth, seventh, and eighth data B6, B7, and B8 may be sequentially written to memory cells of the selected cell layers.

Figure 10:
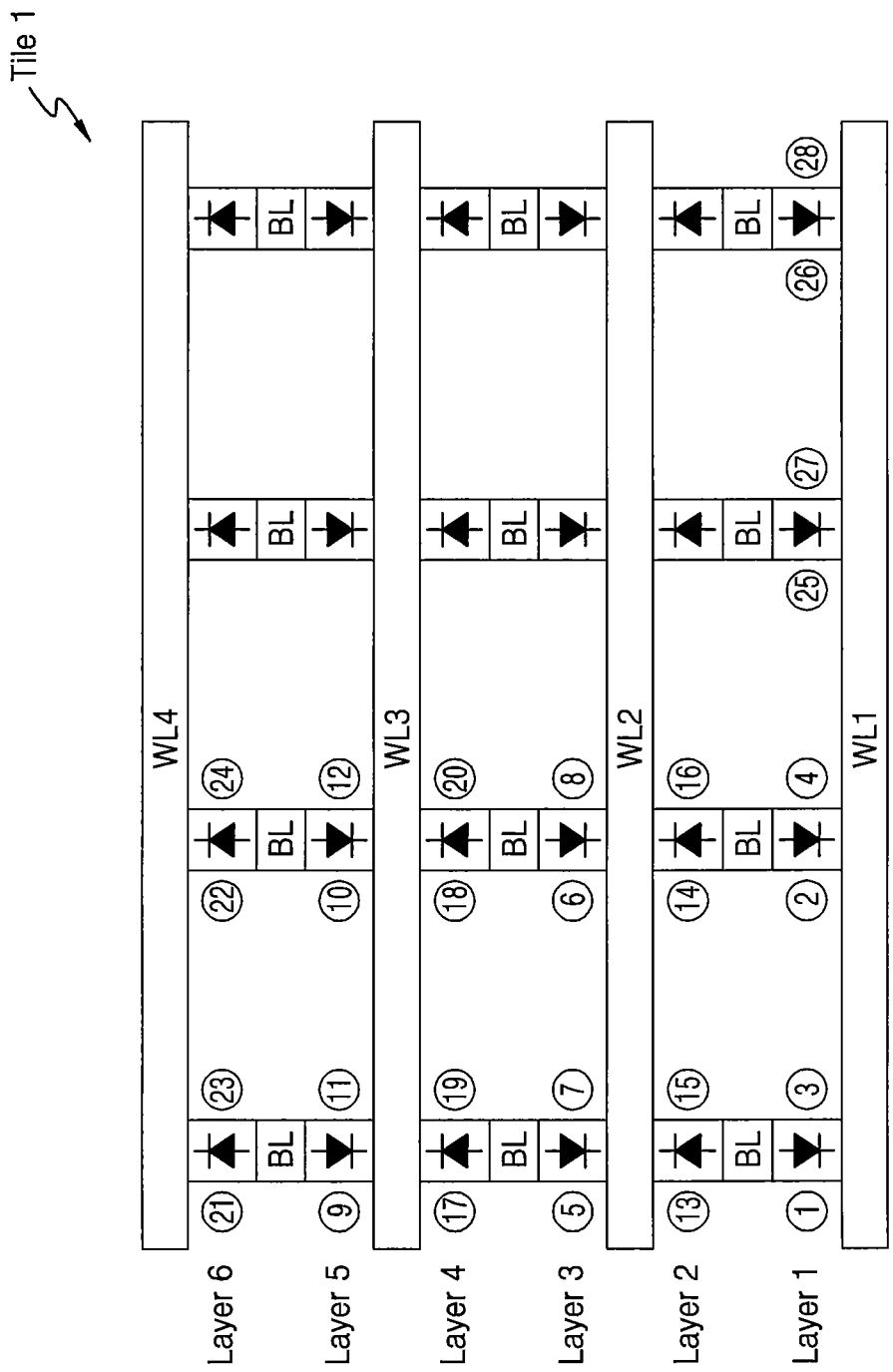
FIGS. 10 and 11 illustrate an addressing order controlled based on a tile according to some embodiments of the inventive concepts.
Figure 11:
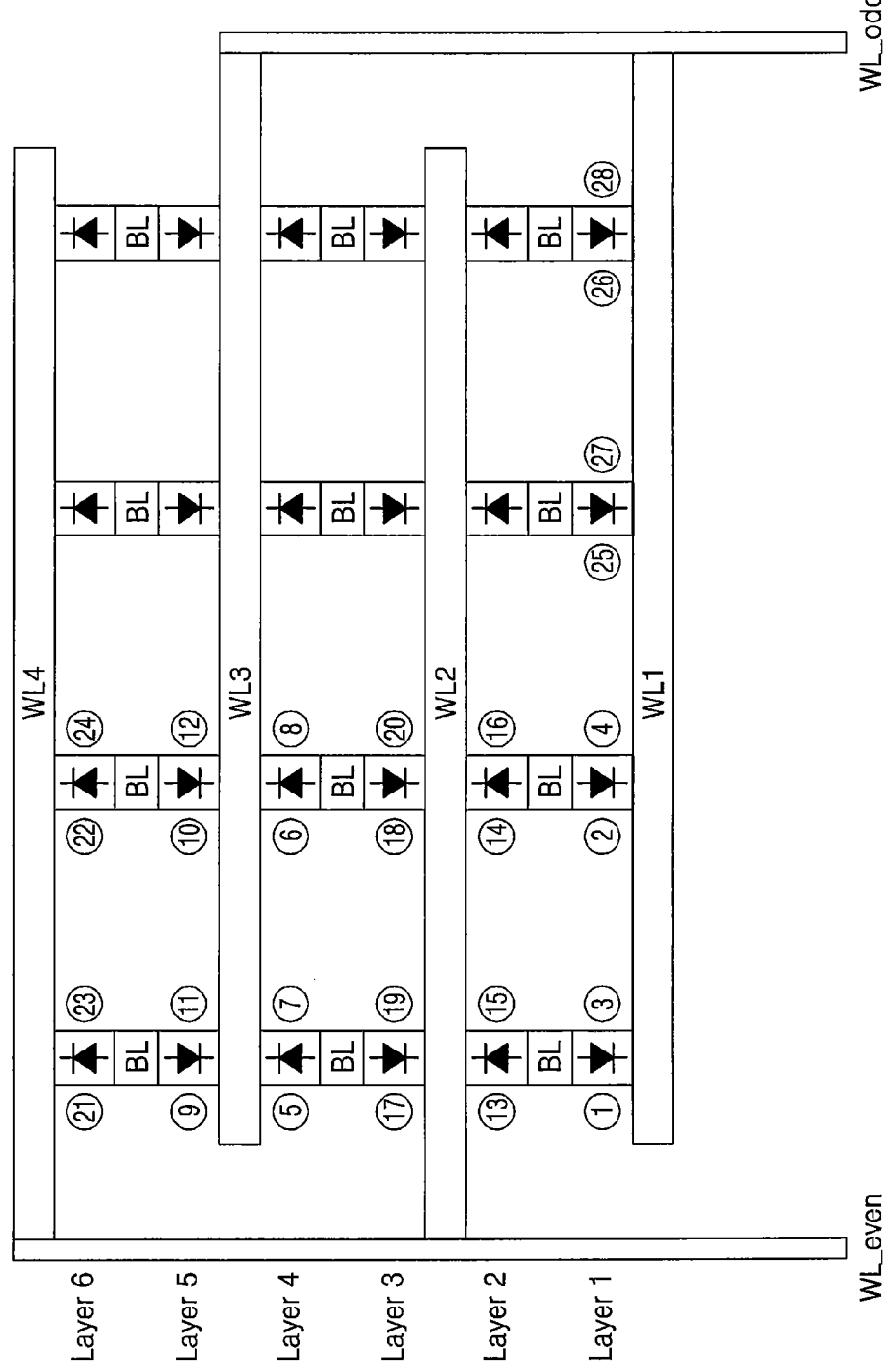

FIGS. 10 and 11 illustrate an addressing order controlled based on a tile according to some embodiments of the inventive concepts. FIGS. 10 and 11 illustrate a MLC that stores 2-bit data. Also, an example in which adjacent cell layers share a word line (or a bit line) is illustrated, and first through fourth word lines WL1 through WL4 and first through sixth cell layers (Layer 1 through Layer 6) connected thereto are illustrated. In regard to description of the embodiments of FIGS. 10 and 11, it is assumed that a data access operation is a data write operation.

According to the embodiment of FIG. 10, after data is written to all memory cells included in a tile (for example, the first tile (Tile 1)), then memory cells of another tile are accessed. First, when a write voltage is provided to the first word line WL1, an inhibit voltage may be provided to other word lines WL2 through WL4. A cell layer connected to the first word line WL1 may be selected, and for example, as the first layer (Layer 1) is selected, data may be written to memory cells of the first layer (Layer 1). While FIG. 10 illustrates an example in which 1 bit-data is stored in a MLC as in FIG. 9B and then data of a next bit is written to another MLC, embodiments is not limited thereto, and data may also be written in the same manner as the embodiment FIG. 9A described above.

After data is written to memory cells of the first layer (Layer 1), another layer may be arbitrarily selected and an access operation may be performed. For example, a write voltage may be provided to the second word line WL2, and an inhibit voltage may be provided to other word lines WL1, WL3, and WL4, and one of cell layers (for example, second and third layers) connected to the second word line WL2 may be selected. After data is written to memory cells of the third layer (Layer 3), other layers may be arbitrarily selected, and for example, as a write voltage is provided to the third word line WL3, a fifth layer (Layer 5) may be selected.

Next, in order to perform a data write operation on other cell layers, a write voltage may be applied and a cell layer may be selected. For example, a write voltage may be provided to the second word line WL2, and data may be written to memory cells of the second layer (Layer 2) connected to the second word line WL2. Next, a write voltage may be sequentially applied to the third and fourth word lines WL3 and WL4, and accordingly, a fourth layer (Layer 4) and a sixth layer (Layer 6) may be sequentially selected to write data thereto.

Referring to FIG. 10, when a first layer (Layer 1) is selected, data is written to some of memory cells disposed in the first layer (Layer 1), and accordingly, a write voltage is applied to the first through fourth word lines WL1 through WL4 again in order to store data in the rest of memory cells included in the first tile (Tile 1), and also, data may be written to memory cells of the first through sixth layers (Layer 1 through Layer 6) connected to the first through fourth word lines WL1 through WL4. According to another exemplary embodiment, when the first layer (Layer 1) is selected, after data is written to all of memory cells disposed in the first layer (Layer 1), another layer may be selected and a data write operation may be performed.

Meanwhile, as illustrated in FIGS. 10 and 11, a word line (or a bit line) may be shared between multiple cell layers in a tile. Referring to FIGS. 10 and 11, the second layer (Layer 2) and the third layer (Layer 3) share a second word line WL2, and the fourth layer (Layer 4) and the fifth layer (Layer 5) share a third word line WL3. Although not illustrated in FIG. 11, as a memory device according to some embodiments has a cross point array structure, the first layer (Layer 1) and the second layer (Layer 2) may share a bit line, and the third layer (Layer 3) and the fourth layer (Layer 4) may share a bit line, and the fifth layer (Layer 5) and the sixth layer (Layer 6) may share a bit line.

Also, according to some embodiments, as illustrated in FIG. 11, word lines (or bit lines) of at least some cell layers may be electrically connected to one another. For example, multiple word lines included in a tile may be classified as an even word line WL_even and an odd word line WL_odd, and word lines corresponding to even word lines WL_even may be electrically connected to one another, and word lines corresponding to odd word lines WL_odd may be electrically connected to one another. According to the embodiment of FIG. 11, as the second word line WL2 and the fourth word line WL4 correspond to even word lines WL_even, they may be electrically connected to each other, and as the first word line WL1 and the third word line WL3 correspond to odd word lines WL_odd, they may be electrically connected to each other. In other words, some word lines may be connected to a common line disposed in a direction in which multiple cell layers are stacked, and the rest of word lines are connected to the other common line.

When performing a data write operation on the first tile (Tile 1), as a write voltage is applied to the first word line WL1 corresponding to an odd word line WL_odd, the write voltage is also applied to the third word line WL3 that is electrically connected to the first word line WL1. On the other hand, an inhibit voltage may be applied to the second word line WL2 and the fourth word line WL4.

As a write voltage is applied to the first word line WL1, the first layer (Layer 1) may be selected, and data may be written to memory cells included in the first layer (Layer 1). Next, when selecting another cell layer to store data, another cell layer in which a write voltage is applied to a corresponding word line may be selected. Accordingly, data may be written to memory cells connected to the third word line WL3, and for example, as the fourth layer (Layer 4) is selected, data may be written to memory cells included in the fourth layer (Layer 4), and then, as the fifth layer (Layer 5) is selected, data may be written to memory cells included in the fifth layer (Layer 5).

After a data write operation is performed on memory cells connected to word lines WL1 and WL3 corresponding to odd word line WL_odd a write voltage may be applied to word lines corresponding to even word lines WL_even. For example, a write voltage may be applied to the second word line WL2 and the fourth word line WL4, and an inhibit voltage may be applied to the rest, the first word line WL1 and the third word line WL3.

A data write operation on memory cells connected to the second word line WL2 is performed, and for example, as the second layer (Layer 2) is selected, data is written to memory cells included in the second layer (Layer 2), and then as the third layer (Layer 3) is, selected, data may be written to memory cells included in the third layer (Layer 3). Also, data may be written to memory cells connected to the fourth word line WL4, and for example, as the sixth layer (Layer 6) is selected, data may be written to memory cells included in the sixth layer (Layer 6).

As illustrated in FIGS. 10 and 11, after a data write operation on the first tile (Tile 1) is completed, a data write operation on other tiles may be performed.

Hereinafter, various embodiments of the inventive concepts will be described. For convenience of description, word lines, bit lines, and memory cells will be illustrated as simple circuit diagrams.

Figure 12:
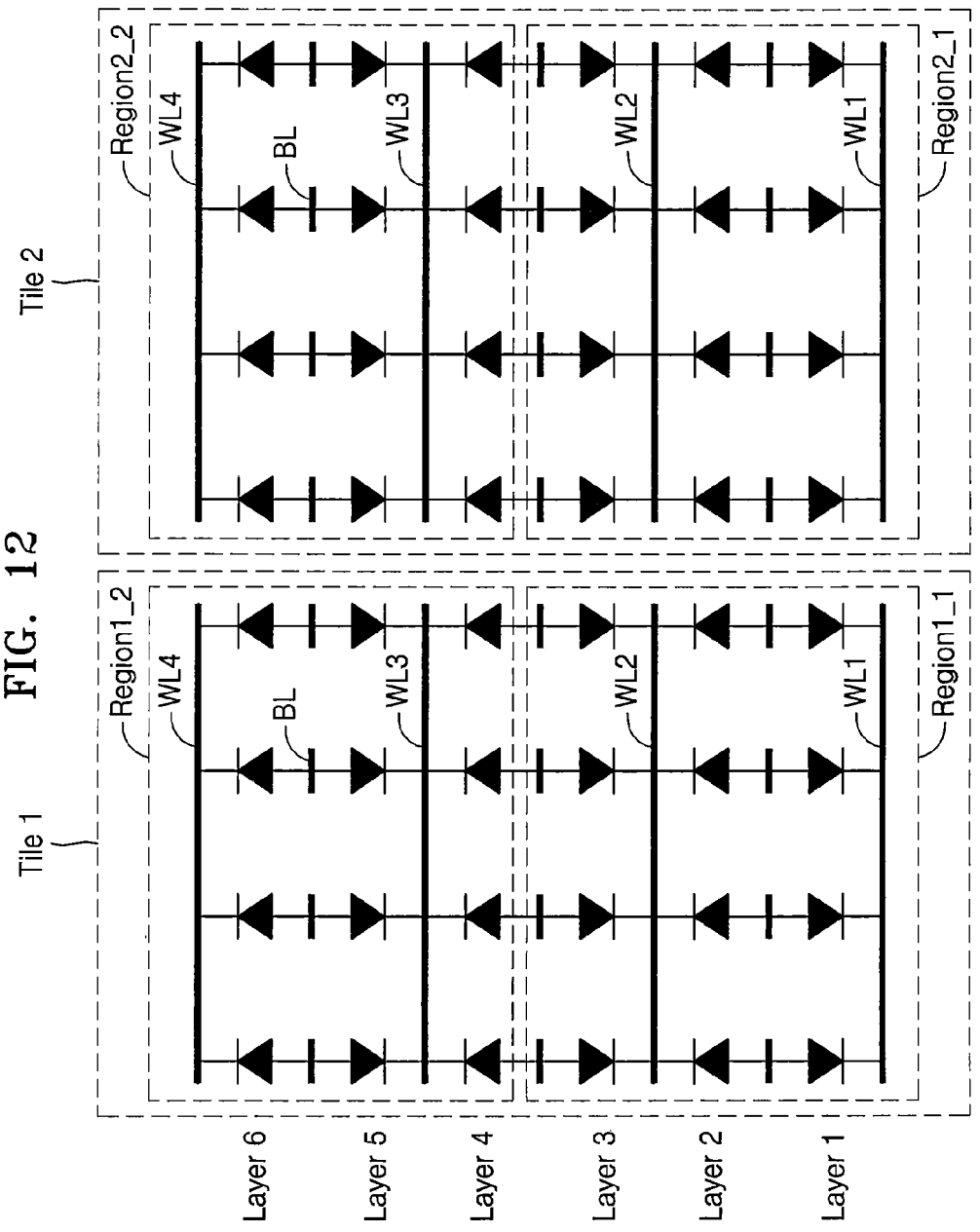
FIGS. 12 through 14 illustrate an access operation according to some embodiments of the inventive concepts.
Figure 13:
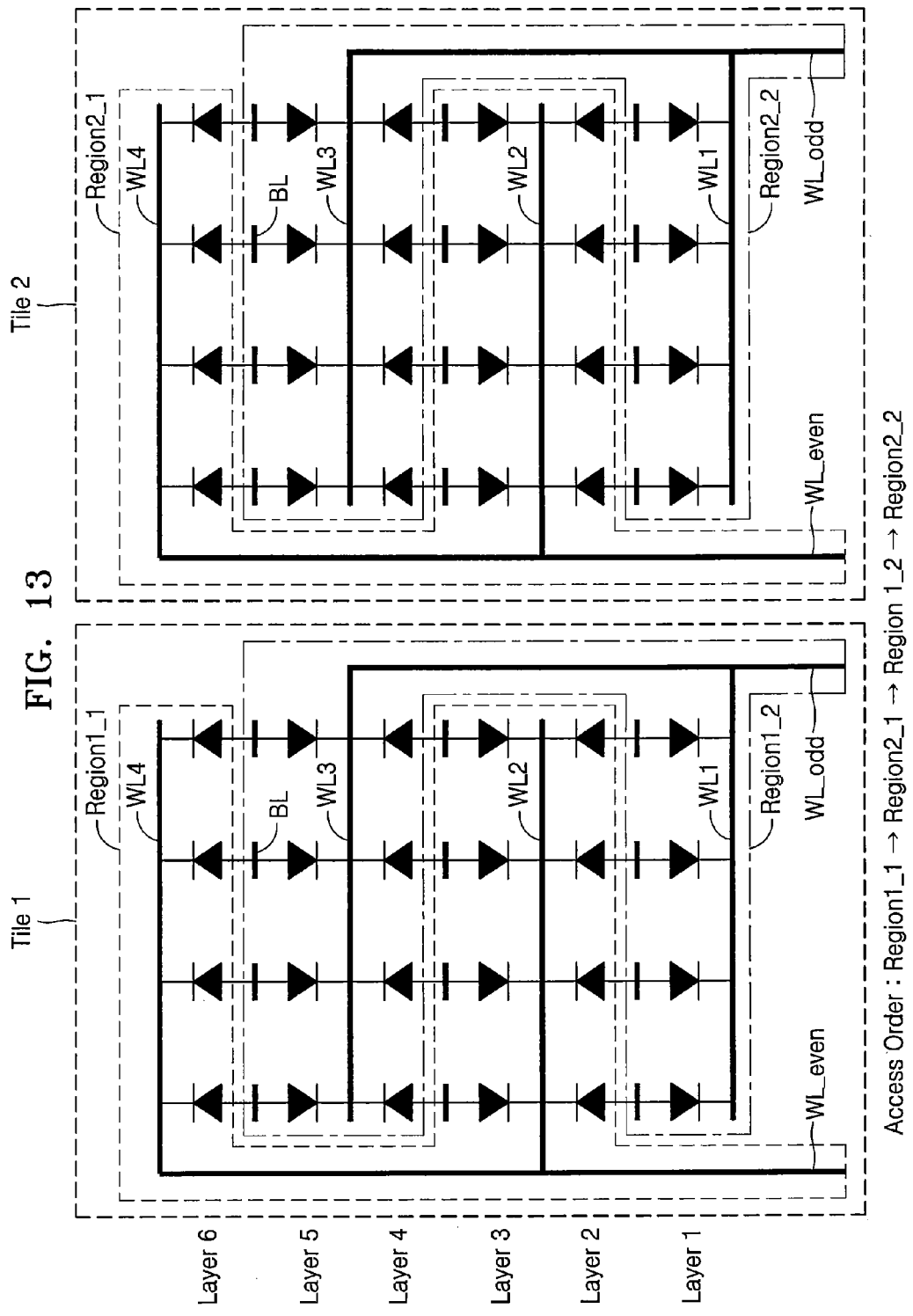
Figure 14:
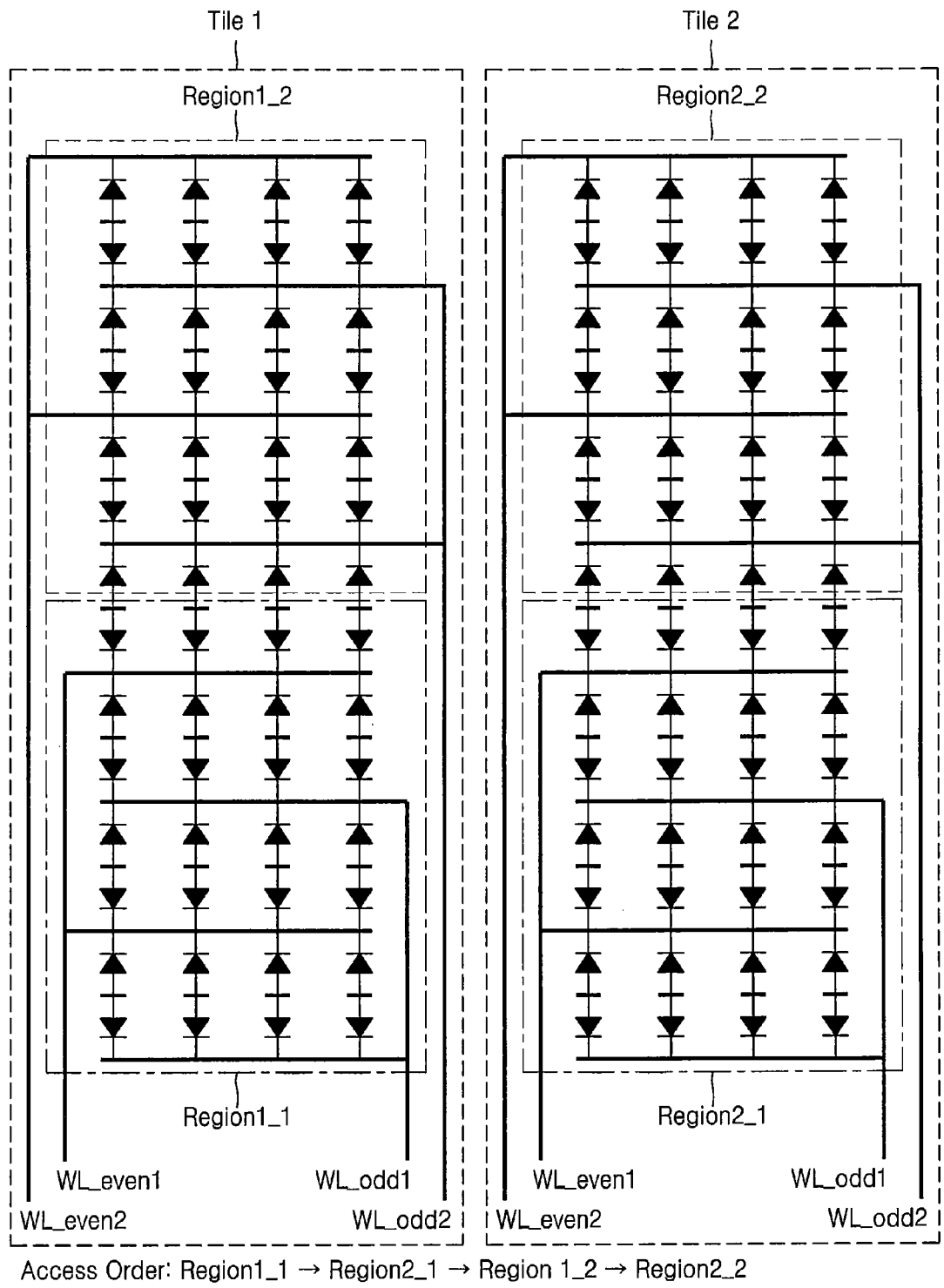

FIGS. 12 through 14 illustrate an access operation according to some embodiments of the inventive concepts. In FIGS. 12 through 14, each tile is divided into at least two regions, and an addressing order is set based on the regions.

As illustrated in FIG. 12, each of a first tile (Tile 1) and a second tile (Tile 2) may include multiple regions. For example, the first tile (Tile 1) may include a first region (Region 1_1) and a second region (Region 1_2), and each region may include multiple layers. Similarly, the second tile (Tile 2) may include a first region (Region 2_1) and a second region (Region 2_2), and each region may include multiple, layers.

An addressing order of accessing data may be set based on the above regions. For example, after memory cells of a region are accessed, then memory cells of a region of another tile may be accessed. For example, after memory cells of the first region (Region 1_1) of the first tile (Tile 1) are accessed, then memory cells of the first region (Region 2_1) of the second tile (Tile 2) may be accessed, and then after memory cells of the second region (Region 1_2) of the first tile (Tile 1) are accessed, memory cells of the second region (Region 2_2) of the second tile (Tile 2) may be accessed.

Meanwhile, multiple layers included in each region may be selected arbitrarily. For example, when accessing memory cells of the first region (Region 1_1) of the first tile (Tile 1), as a selection voltage is applied to the first word line WL1, memory cells of the first layer (Layer 1) may be accessed, and as a selection voltage is applied to the second word line WL2, memory cells of the second layer (Layer 2) and the third layer (Layer 3) may be accessed.

Meanwhile, as illustrated in FIG. 13, when defining regions in each tile, memory cells of at least two layers which are not adjacent to each other may be defined as the same region. For example, in the first tile (Tile 1), as the second word line WL2 and the fourth word line WL4 correspond to even word lines WL_even, they may be electrically connected to each other, and as the first word line WL1 and the third word line WL3 correspond to odd word lines WL_odd, they may be electrically connected to each other. Here, memory cells of multiple layers connected to an even word line WL_even may be defined as the first region (Region 1_1), and memory cells of multiple layers connected to an odd word line WL_odd may be defined as the second region (Region 1_2). Similarly, in the second tile (Tile 2), memory cells of multiple layers connected to an even word line (WL_even) may be defined as the first region (Region 2_1), and memory cells of multiple layers connected to an odd word line WL_odd may be defined as the second region (Region 2_2).

Similarly to the embodiment of FIG. 12, an address order of accessing data may be set based on the above regions. For example, after memory cells of the first region (Region 1_1) of the first tile (Tile 1) are accessed, then memory cells of the first region (Region 2_1) of the second tile (Tile 2) may be accessed, and subsequently, after memory cells of the second region (Region 1_2) of the first tile (Tile 1) are accessed, memory cells of the second region (Region 2_2) of the second tile (Tile 2) may be accessed.

According to the present embodiment, when accessing memory cells of the first region (Region 1_1) of the first tile (Tile 1), memory cells of multiple layers may be accessed while maintaining a voltage level applied to the word lines. For example, as the first region (Region 1_1) is selected, a selection voltage may be applied to the second word line WL2 and the fourth word line WL4, and accordingly, while application of the selection voltage is maintained, memory cells of the layers (e.g., second, third, and sixth layers) of the first region (Region 1_1) may be accessed. After the access operation on the first region (Region 1_1) is completed, a voltage level provided to the word lines is changed to apply a selection voltage to the first word line WL1 and the third word line WL3, and accordingly, memory cells of the layers of the second region (Region 1_2) (for example, first, fourth, and fifth layers) may be accessed. According to the above operation, power used in the data access operation may be reduced.

Meanwhile, FIG. 14 illustrates an example of defining a region when word lines and bit lines having a different structure from those of FIGS. 12 and 13 are included. As illustrated in FIG. 14, each tile may include at least two even word lines WL_even1 and WL_even2 and at least two odd word lines WL_odd1 and WL_odd2. For example, a first even word line WL_even1 and a first odd word line WL_odd1 may be alternately arranged, and also, a second even word line WL_even2 and a second odd word line WL_odd2 may be alternately arranged.

In the first tile (Tile 1), memory cells of cell layers connected to the first even word line WL_even1 or the first odd word line WL_odd1 may be defined as a first region (Region 1_1), and also, memory cells of cell layers connected to the second even word line WL_even2 or the second odd word line WL_odd2 may be defined as a second region (Region 1_2). Similarly, in the second tile (Tile 2), memory cells of cell layers connected to the first even word line WL_even1 or the first odd word line WL_odd1 may be defined as a first region (Region 2_1), and also, memory cells of cell layers connected to the second even word line WL_even2 or the second odd word line WL_odd2 may be defined as a second region (Region 2_2).

Also, according to the embodiment of FIG. 14, an addressing order of accessing data may be set based on the above regions, and for example, after memory cells of the first region (Region 1_1) of the first tile (Tile 1) are accessed, then memory cells of the first region (Region 2_1) of the second tile (Tile 2) may be accessed, and subsequently, after memory cells of the second region (Region 1_2) of the first tile (Tile 1) are accessed, memory cells of the second region (Region 2_2) of the second tile (Tile 2) may be accessed.

According to the embodiment of FIG. 14, as accessing of memory cells of multiple cell layers having word lines that are electrically connected to one another is continuously performed, a frequency of changing a level of a voltage applied to word lines may be reduced, and power consumption may be reduced accordingly. Also, by defining regions in various manners according to structures of word lines and bit lines of each tile, addressing efficiency with respect to memory cells may be improved.

Figure 15:
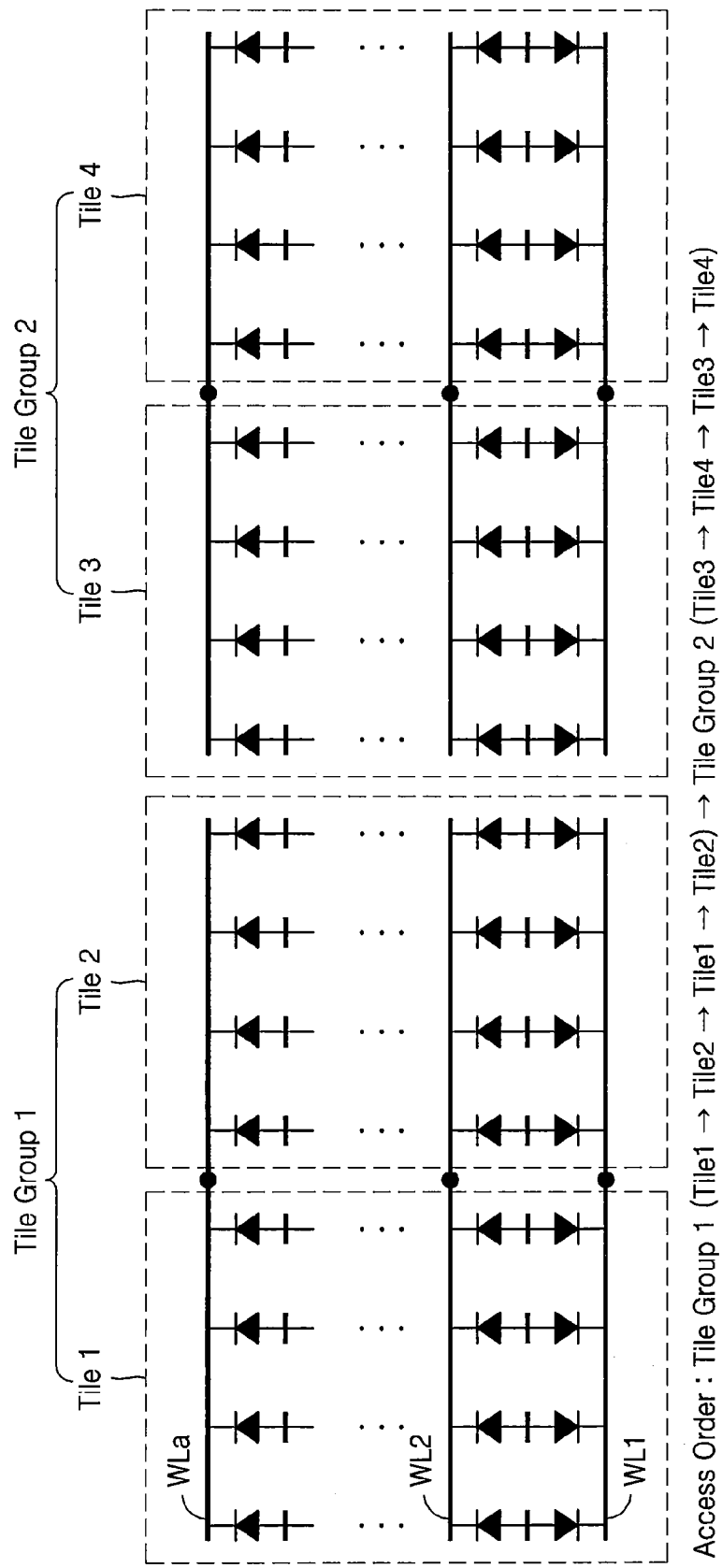
FIGS. 15 and 16 illustrate an access operation according to other embodiments of the inventive concepts.
Figure 16:
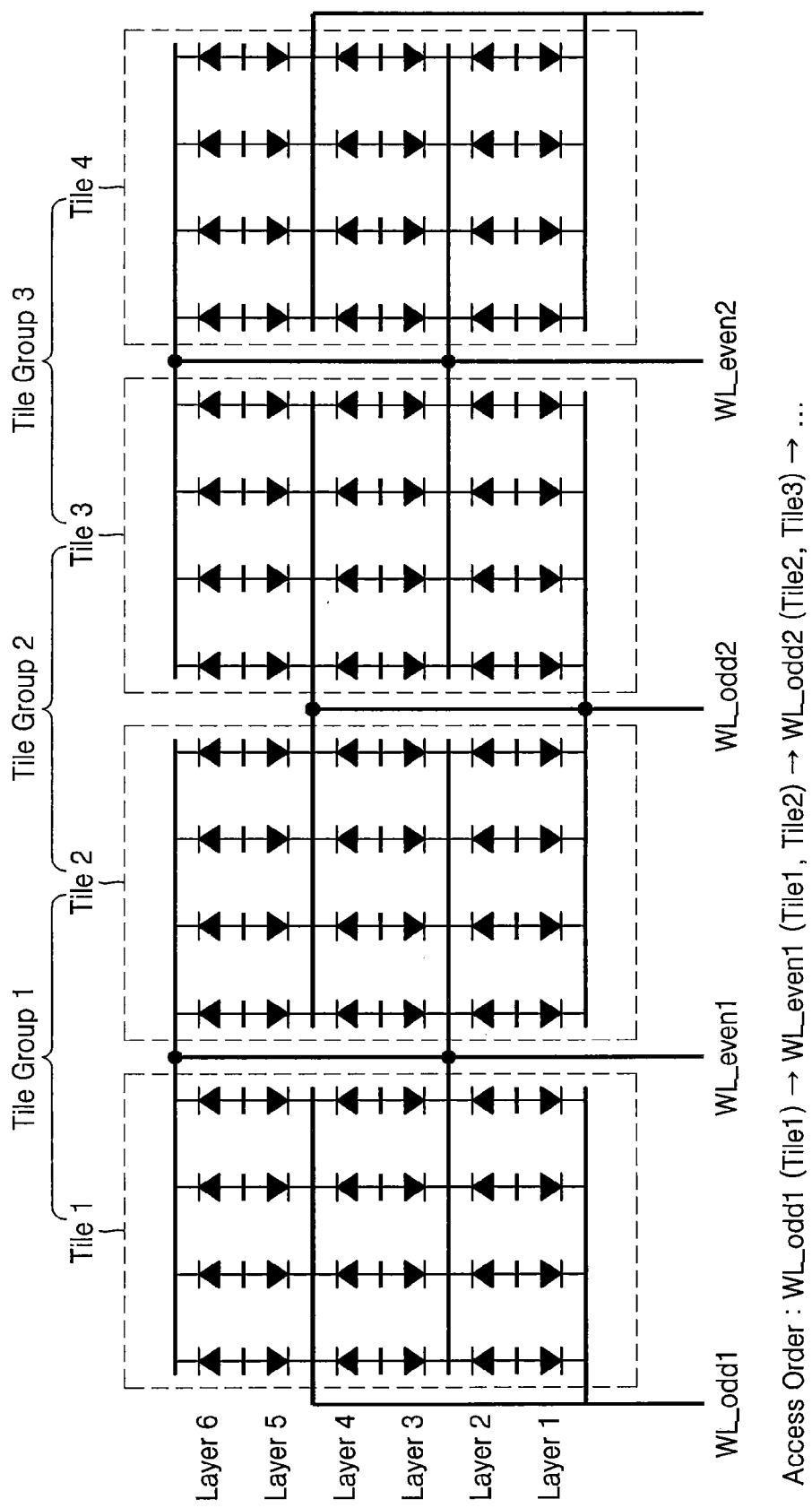

FIGS. 15 and 16 illustrate an access operation according to other embodiments of the inventive concepts. Referring to FIGS. 15 and 16, two tiles are defined as a tile group, and an addressing order is set based on the tile group.

As illustrated in FIG. 15, a tile group may include multiple tiles, and for example, a firs tile group (Tile Group 1) may include a first tile (Tile 1) and a second tile (Tile 2), and a second tile group (Tile Group 2) may include a third tile (Tile 3) and a fourth tile (Tile 4). Multiple tiles belonging to the same tile group may share at least one line; for example, a word line or a bit line may be shared by multiple tiles. According to the embodiment of FIG. 15, the first tile (Tile 1) and the second tile (Tile 2) share word lines, and accordingly, multiple word lines disposed in the first tile group (Tile Group 1) may be shared by the first tile (Tile 1) and the second tile (Tile 2).

According to the present embodiment, after memory cells of all layers of a tile group are accessed, memory cells of another tile group may be accessed. For example, after memory cells of the first tile group (Tile Group 1) are accessed, memory cells of the second tile group (Tile Group 2) may be accessed. An addressing order may be variously set within each tile group. For example, in the first tile group (Tile Group 1), memory cells of the first tile (Tile 1) and the second tile (Tile 2) may be alternately accessed, and then memory cells of the third tile (Tile 3) and the fourth tile (Tile 4) of the second tile group (Tile Group 2) may be alternately selected and accessed.

While FIG. 15 illustrates that multiple word lines WL1 through WLa are electrically separated from one another, embodiments of the inventive concepts are not limited thereto. For example, as in the embodiments of FIGS. 13 and 14 described above, at least some word lines may be electrically connected to one another. Assuming that some word lines correspond to even word lines and the rest of word lines correspond to odd word lines, in regard to accessing memory cells of multiple layers, an addressing order may be set such that after accessing memory cells of multiple layers connected to the even word lines, memory cells of multiple layers connected to the odd word lines are accessed.

FIG. 16 illustrates an example in which at least one line has an interleave structure. For example, a word line having an interleave structure is illustrated. As illustrated in FIG. 16, a tile group may include multiple tiles, and a first tile group (Tile Group 1) may include a first tile (Tile 1) and a second tile (Tile 2), and a second tile group (Tile Group 2) may include the second tile (Tile 2) and a third tile (Tile 3), and also, a third tile group (Tile Group 3) may include the third tile (Tile 3) and a fourth tile (Tile 4). That is, when defining a tile group, one tile may belong to more than one tile group, and/or a tile group to which any one tile belongs may be varied.

Multiple even word lines and multiple odd word lines may be disposed according to multiple tiles included in a memory device. For example, a first odd word line WL_odd1 may be connected to memory cells of some layers of the first tile (Tile 1), and as the first even word line WL_even1 is connected to memory cells of the rest of layers of the first tile (Tile 1), it may be connected to memory cells of some layers of the second tile (Tile 2) at the same time. Also, as the second odd word line WL_odd2 is connected to memory cells of the rest of layers of the second tile (Tile 2), it may be connected to memory cells of some layers of the third tile (Tile 3) at the same time. When describing the above structure with respect to the second tile (Tile 2), at least some word lines of the second tile (Tile 2) may be shared by the first tile (Tile 1), and also, the rest of word lines of the second tile (Tile 2) may be shared by the third tile (Tile 3).

An addressing order of accessing memory cells may be set based on a tile group. For example, the first tile group (Tile Group 1) may be selected first, and then as a selection voltage is applied to a first odd word line WL_odd1, layers (e.g., first, fourth, and fifth layers) may be selected from the first tile (Tile 1), and memory cells included in the first, fourth, and fifth layers connected to the first odd word line WL_odd1 may be accessed. Next, as a selection voltage is applied to the first even word line WL_even1, layers (for example, second, third, and sixth layers) may be selected from the first tile (Tile 1), and layers (for example, second, third, and sixth layers) may be selected from the second tile (Tile 2). Accordingly, memory cells included in the second, third, and sixth layers connected to the first even word line WL_even1 of the first tile (Tile 1) and memory cells included in the second, third, and sixth layers connected to the first even word line WL_even1 of the second tile (Tile 2) may be accessed.

Next, the second tile group (Tile Group 2) may be selected, and a selection voltage may be applied to the second odd word line WL_odd2. Accordingly, layers (for example, first, fourth, and fifth layers) may be selected from the second tile (Tile 2), and memory cells included in the first, fourth, and fifth layers connected to the second odd word line WL_odd2 may be accessed. In addition, layers (e.g., first, fourth, and fifth layers) may be selected from the third tile (Tile 3), and memory cells included in the first, fourth, and fifth layers connected to the second odd word line WL_odd2 may be accessed. According to the addressing order described above, memory cells of the third tile group (Tile Group 3) and the other tile groups may be sequentially accessed.

According to the exemplary embodiment of FIG. 16, the addressing order may also be applicable to an interleave structure of a word line (or a bit line). Also, a tile may be included in at least two tile groups. For example, memory cells may be accessed while defining two adjacent tiles as a tile group, and a tile may be removed from the tile group and the other adjacent tile may be included in the tile group to access memory cells. Memory cells of the entire tiles included in the memory device may be accessed in this manner.

Figure 17:
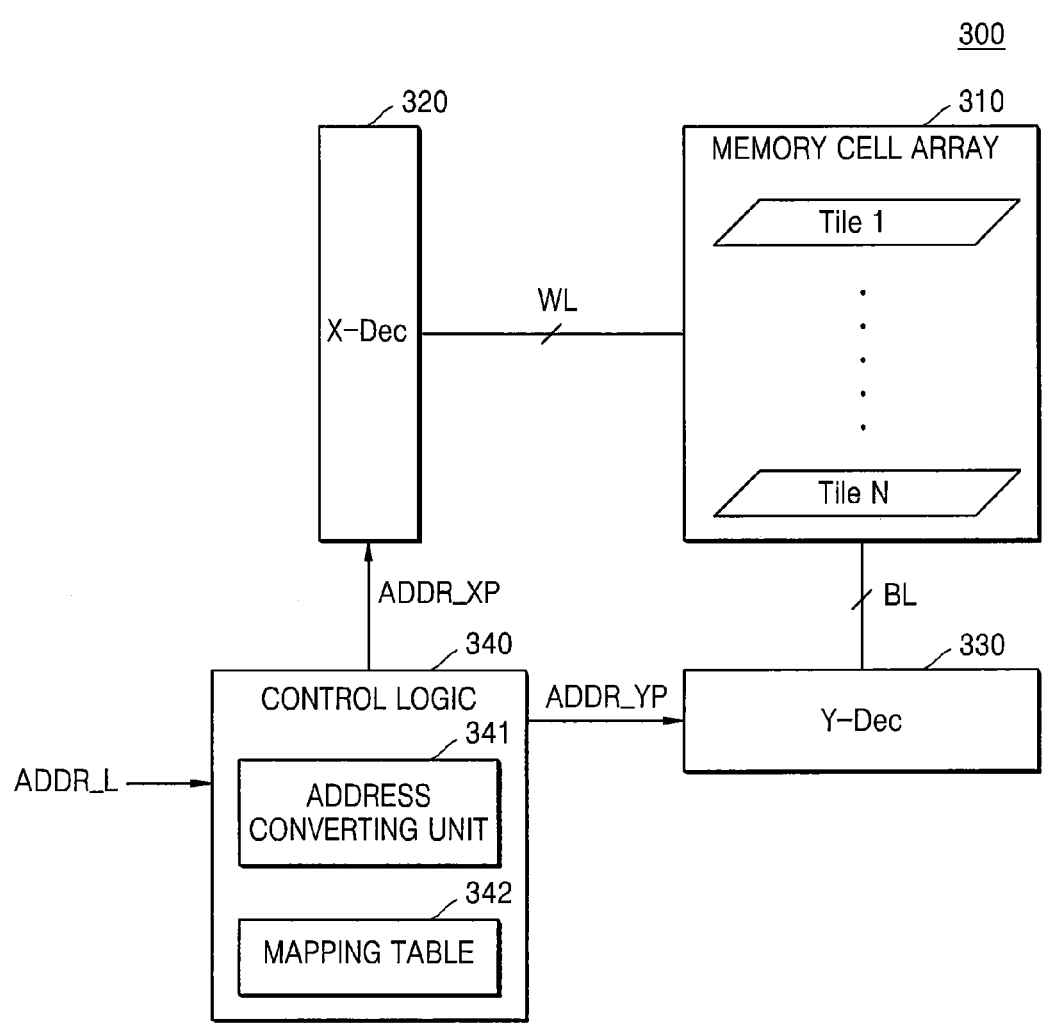
FIG. 17 is a block diagram illustrating memory devices according to other embodiments of the inventive concepts.

FIG. 17 is a block diagram illustrating a memory device 300 according to other embodiments of the inventive concepts.

As illustrated in FIG. 17, the memory device 300 may include a memory cell array 310, a row decoder 320, a column decoder 330, and a control logic 340. The control logic 340 may control an overall operation of the memory device 300, and may also set an addressing order of memory cells of the memory cell array 310 according to some embodiments of the inventive concepts. For example, the control logic 340 may include an address converting unit 341 and a mapping table 342.

As in the above-described embodiment, the memory device 300 may include multiple cell layers, and the memory cell array 310 may include memory cells included in the multiple cell layers. Also, the memory cells included in the multiple cell layers may be classified as multiple tiles, and accordingly, the memory cell array 310 may include first through Nth tiles (Tile 1 through Tile N). Meanwhile, although not illustrated in FIG. 17, the memory device 300 may further include a write/read circuit and a power generating unit as peripheral circuits for memory operations. Also, while the address converting unit 341 and the mapping table 342 are illustrated as being included in the control logic 340, at least one of the elements may also be disposed outside the control logic 340.

The control logic 340 may receive an address ADDR_L from a memory controller, and the received address may have a value corresponding to a logical address from a host. The address converting unit 341 may convert the address ADDR_L to generate a physical address indicating a memory cell which is actually to be accessed, and the physical address may include a row address ADDR_XP and a column address ADDR_YP. The mapping table 342 may include mapping information related to the address conversion, and the address converting unit 341 may perform an address converting operation by using the mapping information stored in the mapping table 342.

The address converting unit 341 may perform a converting operation such that addressing is performed according to the above-described various embodiments of the inventive concepts. For example, when accessing data including multiple bits, an address may be converted such that an addressing order is set based on tiles. In some embodiments, an address may be converted such that each tile is divided into at least two regions and an addressing order is set based on the regions. In some embodiments, an address may be converted such that a tile group including at least two tiles is defined and an addressing order is set based on the tile group.

Figure 18:
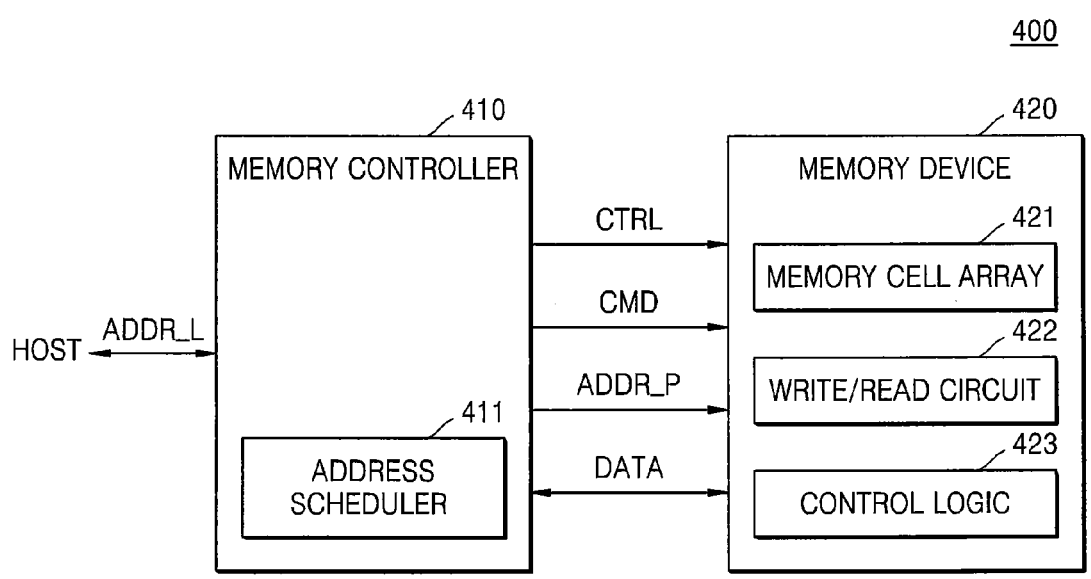
FIG. 18 is a block diagram illustrating a memory system according to other embodiments of the inventive concepts.

FIG. 18 is a block diagram illustrating a memory system 400 according to other embodiments of the inventive concepts. Referring to FIG. 18, the memory system 400 may include a memory controller 410 and a memory device 420. The memory device 420 may include a memory cell array 421, a write/read circuit 422, and a control logic 423. Also, the memory controller 410 may include an address scheduler 411. Elements illustrated in FIG. 18 that are the same or similar to the elements illustrated in FIG. 1 also have the same or similar functions, and thus detailed description thereof will be omitted.

According to the exemplary embodiment of FIG. 18, the memory controller 410 may perform an address converting operation that allows addressing to be performed based on a tile, a region, a tile group or the like. For example, the address scheduler 411 may receive a logical address ADDR_L from a host, and may convert the address ADDR_L to a physical address ADDR_P and provide the memory device 420 with the physical address ADDR_P. The address scheduler 411 may include a mapping table in which mapping information related to address conversion is stored, and may perform an address converting operation by using the mapping information stored in the mapping table.

Figure 19:
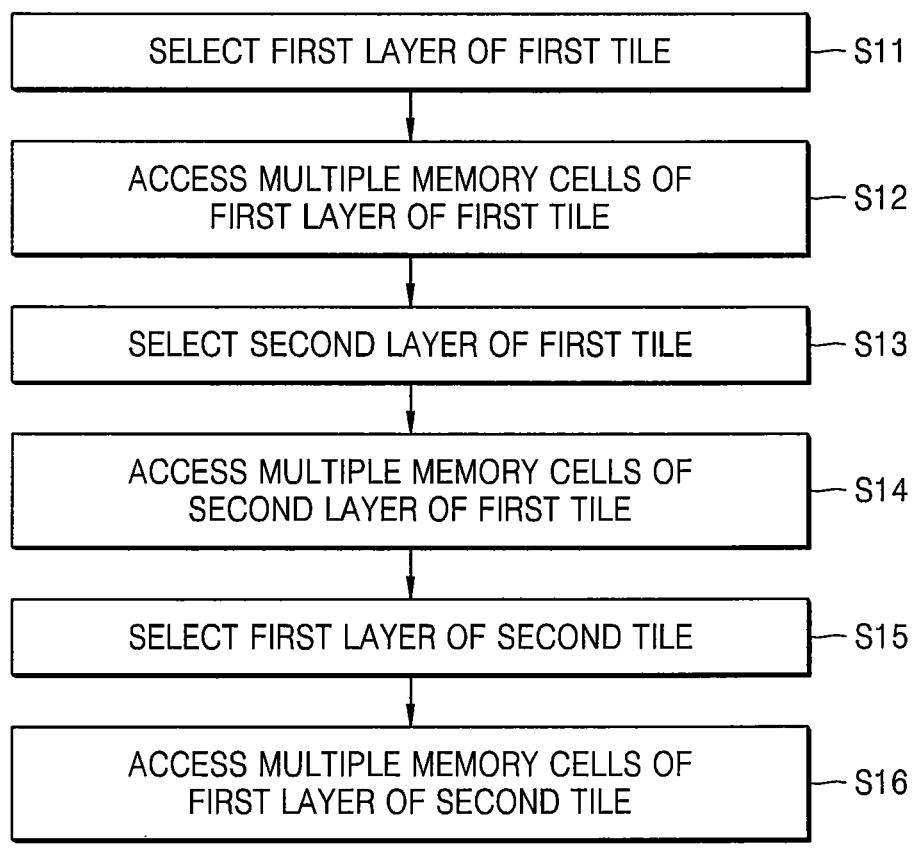
FIG. 19 is a flowchart of methods of operating memory devices according to some embodiments of the inventive concepts.

FIG. 19 is a flowchart of methods of operating a memory device according to some embodiments of the inventive concepts.

In the same or similar manner as the above-described embodiments, the memory device may include multiple cell layers, and also, the memory cells included in the cell arrays may be classified as multiple tiles. According to some embodiments of the inventive concepts, when accessing memory cells, addressing based on a tile, a region, a tile group or the like may be performed.

As illustrated in FIG. 19, a first layer of a first tile may be selected in operation S11. Also, multiple memory cells of the first layer of the first tile may be accessed in operation S12. As each cell array has a cross point array structure, memory cells may be arranged in regions where multiple word lines and multiple bit lines cross each other, and thus, multiple bit lines may cross one word line. According to some embodiments, multiple memory cells disposed in regions where at least one word line and multiple bit lines cross each other may be accessed.

Next, another layer included in the same tile may be selected; for example, a second layer of the first tile may be selected in operation S13. Also, multiple memory cells of the second layer of the first tile may be accessed in operation S14. For example, multiple memory cells that are disposed in regions where at least one word line and multiple bit lines cross each other may be accessed.

After memory cells of a plurality of layers included in one tile are accessed as described above, memory cells included in another tile may be accessed. For example, a first layer of the second tile may be selected in operation S15, and multiple memory cells of the first layer of the second tile may be accessed in operation S16.

Meanwhile, similarly to the above-described embodiment, word lines (or bit lines) of at least two layers may be electrically connected to each other, and memory cells of the layers whose word lines (or bit lines) are electrically connected to each other may be continuously accessed. For example, in the first tile, if word lines of a second layer and a third layer are electrically connected, after memory cells of the second layer and memory cells of the third layer are accessed, memory cells of the second tile may be accessed.

Also, after all memory cells included in the first tile are accessed, memory cells of the second tile may be accessed. Also, after all memory cells of the second tile are accessed, memory cells of the third tile as another tile may be accessed.

Also, similarly to the above-described embodiment, each tile may include multiple regions, and an addressing order may be set based on the regions. For example, if the first region of the first tile includes the first and second layers, after an access operation on the first region is completed, memory cells of the second tile may be accessed. After at least some memory cells of the second tile are accessed, the first tile may be selected again and an access operation on memory cells of another layer included in the second region of the first tile may be performed.

Also, similarly to the above-described embodiment, a tile group may be defined, and the tile group may include at least two tiles. In FIG. 19, first and second tiles may be included in a first tile group, and a second tile group as another tile group may include third and fourth tiles. As illustrated in FIG. 19, after memory cells of the first and second tiles of the first tile group are accessed, memory cells of the second tile group may be accessed.

Figure 20:
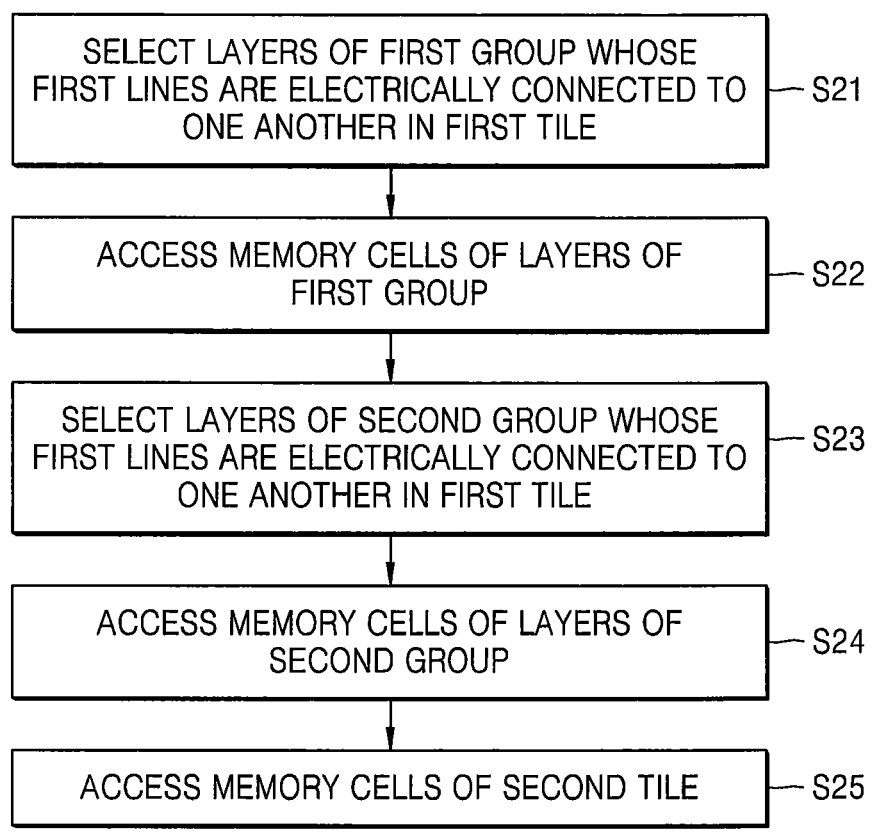
FIG. 20 is a flowchart of methods of operating memory devices according to other embodiments of the inventive concepts.

FIG. 20 is a flowchart of methods of operating a memory device according to other embodiments of the inventive concepts. Referring to FIG. 20, an example in which at least two layers share a word line (or a bit line) is described; for example, a first line may be a word line and a second line may be a bit line in FIG. 20. In some embodiments, a first line may be a bit line and a second line may be a word line in FIG. 20.

As illustrated in FIG. 20, in a first tile, multiple layers (for example, layers of a first group) whose first lines are electrically connected to one another may be selected in operation S21. As the layers of the first group are selected, memory cells included in the layers of the first group may be accessed in operation S22. An order according to which layers of a group are accessed may be set arbitrarily. Also, as in the above-described embodiment, while memory cells of layers of a group are being accessed, a voltage level applied to the first lines may not be changed.

Next, in the first tile, the rest of multiple layers (for example, layers of a second group) whose first lines are electrically connected to one another may be selected in operation S23. Also, as the layers of the second group are selected, memory cells included in the layers of the second group may be accessed in operation S24. After an access operation on the memory cells of the layers of the first tile is performed according to the above operation, memory cells of the second tile may be accessed in operation S25.

Figure 21:
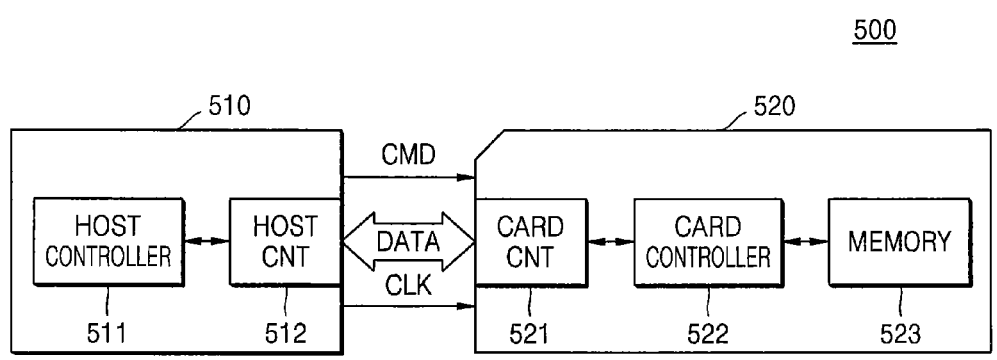
FIG. 21 is a block diagram of a memory card system having a memory system applied thereto, according to some embodiments of the inventive concepts.

FIG. 21 is a block diagram of a memory card system 500 having a memory system applied thereto, according to some embodiments of the inventive concepts.

Referring to FIG. 21, the memory card system 500 may include a host 510 and a memory card 520. The host 510 may include a host controller 511 and a host connection portion 512. The memory card 520 may include a card connection portion 521, a card controller 522, and a memory controller 523. The memory device 523 may be implemented by using the embodiments illustrated in FIGS. 1 through 20, and accordingly, the memory device 523 may include multiple layers, and a memory cell array included in the memory device 523 may include multiple tiles. Also, when accessing memory cells of a memory cell array, addressing based on a tile, a region, a tile group or the like may be performed.

The host 510 may write data to the memory card 520 or read data stored in the memory card 520. The host controller 511 may transmit a command CMD, a, clock signal CLK generated in a clock generator in the host 510, and data DATA to the memory card 520 via the host connection portion 512.

The card controller 522 may store data in the memory device 523 in synchronization with a clock signal generated in a clock generator in the card controller 522 in response to a command received by using the card connection portion 521. The memory device 523 may store data transmitted by the host 510.

The memory card 520 may be implemented as a compact flash card (CFC), a Microdrive, a smart media card (SMC), and a multimedia card (MMC), a security digital card (SDC), a memory stick, and/or a Universal Serial Bus (USB) flash memory driver.

Figure 22:
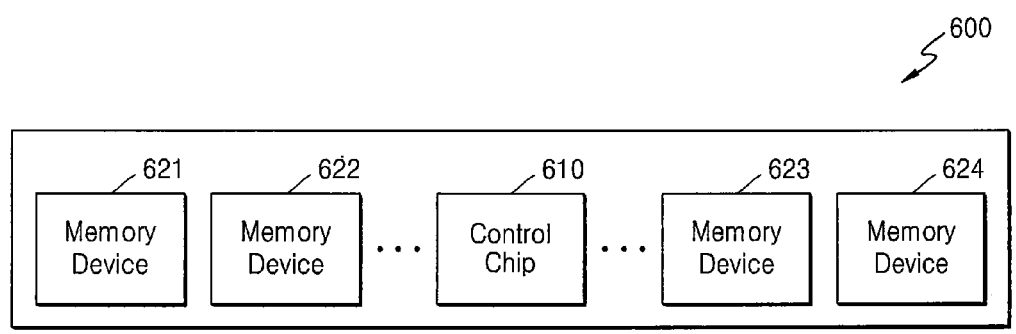
FIG. 22 illustrates a memory module, according to some embodiments of the inventive concepts.

FIG. 22 illustrates a memory module 600 according to some embodiments of the inventive concepts. Referring to FIG. 22, the memory module 600 may include memory devices 621 through 624 and a control chip 610. The memory devices 621 through 624 may be implemented by using the embodiments illustrated in FIGS. 1 through 20. The control chip 610 may control the memory devices 621 through 624 in response to various signals transmitted by using an external memory controller. For example, the control chip 610 may control a write operation and a read operation by activating the memory devices 621 and 624 corresponding to various commands and addresses transmitted from the outside (e.g., from an external device). Also, the control chip 610 may perform various subsequent processes on read data output by using the memory devices 621 through 624, and may perform, for example, an error detection and correction operation on the read data.

According to embodiments of the inventive concepts, the memory devices 621 through 624 may include multiple layers, and a memory cell array included in each of the memory devices 621 through 624 may include multiple tiles. Also, when accessing memory cells of the memory cell array, addressing based on a tile, a region, a tile group or the like may be performed.

Figure 23:
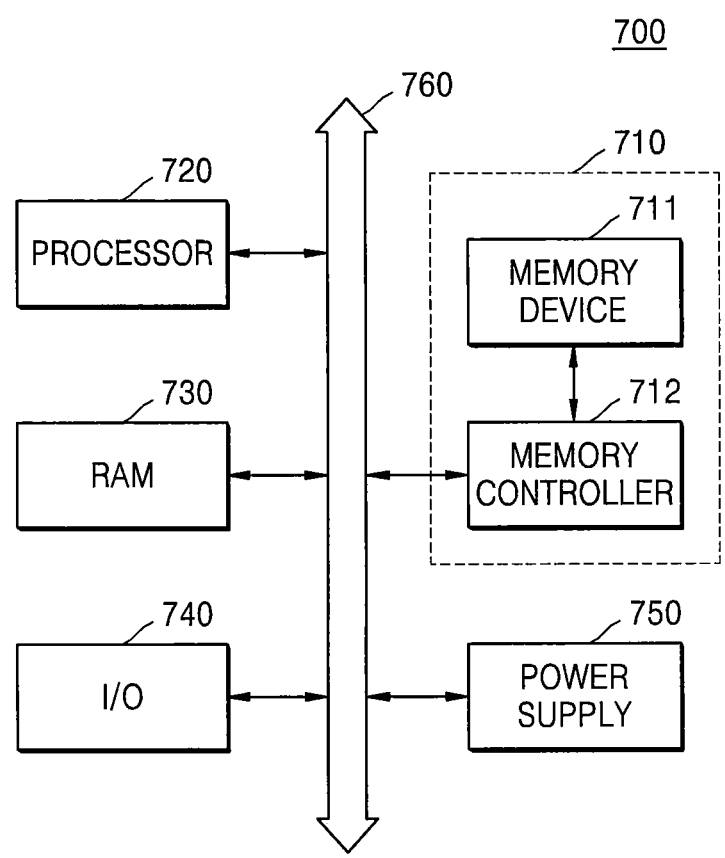
FIG. 23 is a block diagram of a computing system including a memory system according to embodiments of the inventive concepts.

FIG. 23 is a block diagram of a computing system 700 including a memory system, according to some embodiments of the inventive concepts.

Referring to FIG. 23, the computing system 700 may include a memory system 710, a processor 720; a RAM 730, an input/output (I/O) device 740, and a power supply device 750. The memory system 710 may also include a memory device 711 and a memory controller 712. Although not illustrated in FIG. 23, the computing system 700 may further include ports capable of communicating with a video card, a sound card, a memory card, a USB device, and/or other electronic devices. The computing system 700 may be embodied as a PC, or a portable electronic device such as a notebook computer, a mobile phone, a personal digital assistant (PDA), and/or a camera.

The processor 720 may perform particular calculations or tasks. In one or more embodiments, the processor 720 may be a micro-processor, a Central Processing Unit (CPU), and/or the like. The processor 720 may perform communication with, the RAM 730, the I/O device 740, and the memory system 710 via a bus 760 such as an address bus, a control bus, or a data bus. Here, the memory system 710 and/or the RAM 730 may be embodied by using the embodiments shown in FIGS. 1 through 20.

In one or more embodiments, the processor 720 may also be connected to an extended bus such as a Peripheral Component Interconnect (PCI) bus.

The RAM 730 may store data for operations of the computing system 700. As described above, the memory device according to the one or more embodiments of the inventive concepts may be applied to the RAM 730. In some embodiments, a DRAM, a mobile DRAM, an SRAM, a PRAM, an FRAM, and/or an MRAM may be used as the RAM 730.

The I/O device 740 may include an input unit such as a keyboard, a keypad, and/or a mouse, and an output unit such as a printer or a display. The power supply device 750 may supply an operating voltage for the operations of the computing system 700.

While the inventive concepts have been particularly shown and described with reference to exemplary embodiments thereof, it will be understood that various changes in form and details may be made therein without departing from the spirit and scope of the following claims.

What is claimed is:

1. A method of operating a memory device having a cross point array structure, wherein the memory device includes multiple tiles, and each of the tiles includes memory cells of multiple layers of the memory device, the method comprising:

accessing, in a first one of the tiles, ones of the memory cells of a first layer disposed where one or more first lines and one or more second lines cross each other;

accessing, in the first one of the tiles, ones of the memory cells of a second layer disposed where one or more first lines and one or more second lines cross each other; and accessing, after the memory cells of the multiple layers of the first one of the tiles are accessed, the memory cells included in a second one of the tiles.

2. The method of claim 1, wherein, after ones of the memory cells defining a matrix disposed where multiple ones of the first lines and multiple ones of the second lines cross each other in the first layer of the first one of the tiles are accessed, ones of the memory cells defining a matrix disposed where multiple ones of the first lines and multiple ones of the second lines cross each other in the second layer of the first tile are accessed.

3. The method of claim 1, wherein the first one of the tiles further comprises a third layer, and a first line of the third layer and one of the first lines of the second layer are electrically connected, and after memory cells of the third layer are accessed, the memory cells of the second one of the tiles are accessed.

4. The method of claim 1, wherein after memory cells included in all of the multiple layers of the first one of the tiles are accessed, the memory cells of the second one of the tiles are accessed.

5. The method of claim 1, further comprising accessing the memory cells of a third one of the tiles after the memory cells included in all layers of the second one of the tiles are accessed.

6. The method of claim 1, wherein each of the memory cells of the multiple tiles is a multilevel cell that stores n bits (where n is an integer equal to or greater than 2), and
    after data of n bits is stored in a first one of the memory cells, data of n bits is stored in a second one of the memory cells.

7. The method of claim 1, wherein each of the memory cells of the multiple tiles is a multilevel cell that stores n bits (where n is an integer equal to or greater than 2), and
    data is sequentially stored bit by bit in ones of the memory cells.

8. The method of claim 1, wherein the first one of the tiles comprises a first region and a second region that each includes ones of the multiple layers, and the first region comprises the ones of the memory cells of the first and second layers,
    wherein the method further comprises accessing memory cells of the second region of the first one of the tiles after the memory cells of the second one of the tiles are accessed.

9. The method of claim 8, wherein first lines of the ones of the multiple layers included in the first region are electrically connected to one another, and first lines included in the ones of the multiple layers included in the second region are electrically connected to one another.

10. The method of claim 1, wherein the first and second ones of the tiles define a first tile group, and the memory device further comprises a second tile group including third and fourth ones of the tiles, and
    the first and second ones of the tiles share at least one of the first lines, and the third and fourth ones of the tiles share at least one first line, and
    the method further comprises accessing memory cells of the third and fourth ones of the tiles after all of the memory cells of the first tile group are accessed.

11. The method of claim 1, wherein the second one of the tiles shares at least one first line of a first layer thereof with the first one of the tiles and shares at least one first line of a second layer thereof with a third one of the tiles, and
    the method further comprises accessing ones of the memory cells of the second layer of the second one of the tiles and a second layer of the third one of the tiles after memory cells of the first layer of the second one of the tiles are accessed.

12. A method of operating a memory device having a cross point array structure, wherein the memory device includes multiple tiles, and each of the tiles comprises memory cells of multiple layers, the method comprising:
    accessing, in a first one of the tiles, ones of the memory cells of the multiple layers of a first group having first lines that are electrically connected to one another;
    accessing, in the first one of the tiles, ones of the memory cells of the multiple layers of a second group having first lines that are electrically connected to one another; and
    accessing ones of the memory cells of at least one of the layers included in a second one of the tiles.

13. The method of claim 12, wherein the first lines of the memory device include an even first line and an odd first line, wherein the ones of the memory cells of the multiple layers of the first group are connected to the even first line, and wherein the ones of the memory cells of the multiple layers of the second group are connected to the odd first line.

14. The method of claim 12, wherein, after all of the memory cells of the multiple layers of the first group are accessed, the ones of the memory cells of the multiple layers of the second group are accessed.

15. The method of claim 12, wherein each of the memory cells of the multiple tiles is a multilevel cell that stores n bits (wherein n is an integer equal to or greater than 2), and
    after data of n bits is stored in a first one of the memory cells, data of n bits is stored in a second one of the memory cells or data is sequentially stored bit by bit in multiple ones of the memory cells.

16. A method of operating a memory device comprising respective tiles that include memory cells located on different layers of a memory cell array, the method comprising:
    accessing ones of the memory cells included in a first one of the respective tiles via first selection lines coupled thereto, wherein the ones of the memory cells included in the first one of the respective tiles are located on at least two of the different layers of the memory cell array; and then
    accessing ones of the memory cells included in a second one of the respective tiles via second selection lines coupled thereto, wherein the ones of the memory cells included in the second one of the respective tiles are located on one of the at least two of the different layers of the memory cell array.

17. The method of claim 16, wherein the first selection lines comprise word lines or bit lines that are electrically connected, and wherein a selection voltage applied thereto is maintained during the accessing of the ones of the memory cells included in the first one of the respective tiles that are located on the at least two of the different layers of the memory cell array.

18. The method of claim 17, wherein the ones of the memory cells on the at least two of the different layers define one of a plurality of regions of the first one of the respective tiles, and further comprising:
    after accessing the ones of the memory cells included in the second one of the respective tiles, accessing ones of the memory cells of another one of the plurality of regions of the first one of the respective tiles.

19. The method of claim 17, wherein the first one of the respective tiles and a third one of the respective tiles define a tile group, and further comprising:
    accessing ones of the memory cells included in the third one of the respective tiles prior to accessing the ones of the memory cells included in the second one of the respective tiles.

20. The method of claim 19, wherein the first and third ones of the respective tiles that define the tile group share one of the word lines or bit lines that are electrically connected and coupled to the ones of the memory cells located on the at least two of the different layers of the memory cell array.

* * * * *